US006236956B1

(12) United States Patent
Mantooth et al.

(10) Patent No.: US 6,236,956 B1
(45) Date of Patent: May 22, 2001

(54) COMPONENT-BASED ANALOG AND MIXED-SIGNAL SIMULATION MODEL DEVELOPMENT INCLUDING NEWTON STEP MANAGER

(75) Inventors: H. Alan Mantooth, Fayetteville, AR (US); Douglas K. Cooper, Tigard; Martin Vlach, Portland, both of OR (US)

(73) Assignee: Avant! Corporation, Fremont, CA (US)

( * ) Notice: Subject to any disclaimer, the term of this patent is extended or adjusted under 35 U.S.C. 154(b) by 0 days.

(21) Appl. No.: 09/305,238

(22) Filed: May 4, 1999

Related U.S. Application Data

(63) Continuation-in-part of application No. 08/602,223, filed on Feb. 16, 1996, now Pat. No. 5,963,724.

(51) Int. Cl.[7] ................................................. G06F 17/50
(52) U.S. Cl. ..................... 703/14; 703/4; 703/2
(58) Field of Search .................. 703/1, 2, 3, 4, 703/14; 702/12

(56) References Cited

U.S. PATENT DOCUMENTS

| 4,901,221 | 2/1990 | Kodosky et al. ..................... 364/200 |
|---|---|---|
| 4,914,568 | 4/1990 | Kodosky et al. ..................... 364/200 |
| 5,148,379 | 9/1992 | Konno et al. ........................ 364/578 |
| 5,291,587 | 3/1994 | Kodosky et al. ..................... 395/500 |
| 5,301,301 | 4/1994 | Kodosky et al. ..................... 395/500 |
| 5,301,336 | 4/1994 | Kodosky et al. ..................... 395/800 |
| 5,404,319 | 4/1995 | Smith et al. ........................ 364/578 |
| 5,729,451 | * 3/1998 | Gibbs et al. ......................... 702/12 |

OTHER PUBLICATIONS

V. Moser, P. Nussbaum, H.P. Amann, L.Astier, F. Pellandini, "A graphical approach to analogue behavioural modelling," *IEEE Proc. of European Design and Test Conf.*, pp. 535–539, Mar. 1994.

V. M. Ma, J. Singh, R. Saleh, "Modeling, simulation and optimization of analog macromodels," *IEEE Proc. of CICC '92*, p. 12.1.1, May 1992.

"Saber™ DesignStar™ Design and Modeling Environment", Analogy, Inc., 1991.

Beetem, "Hierarchical Topological Sorting of Apparent Loops via Partitioning", IEEE Transactions on Computer–Aided Design of Integrated Circuits and Systems, pp. 607–619, May 1992.*

Yeager, "Improvement in Norm–Reducing Newton Methods for Circuit Simulation", IEEE Transactions on Computer–Aided Design of Integrated Circuits and Systems, pp. 607–619, May 1989.*

Brambilla et al, "A Control–Based Approach to the Solution of Nonlinear Algebraic Equations", IEEE Transactions on Circuits and Systems I: Fundamental Theory and Applications, pp. 366–369, Apr. 1997.*

Analogy, Inc., *Simulation Product Page*, Jun. 14, 1999, pp. 1–6.

* cited by examiner

*Primary Examiner*—Kevin J. Teska
*Assistant Examiner*—Samuel Broda
(74) *Attorney, Agent, or Firm*—Skjerven, Morrill MacPherson; Omkar K. Suryadevara

(57) ABSTRACT

The Model Editor (106) makes simulation modeling easier and more intuitive by extracting essential information and presenting it to the user, and by providing tools to investigate simulation and model robustness, in an interactive, graphical environment. The Model Editor (106) includes a Newton step manager as an interactive, graphical tool. During simulation of a model, the Newton step manager captures matrix norms. Any indications of Newton limiting are also captured. The matrix norms are plotted as a function of iteration count, and the iterations at which Newton limiting were encountered are identified. Newton step manager can also be run automatically using a functional dependency analysis.

20 Claims, 20 Drawing Sheets

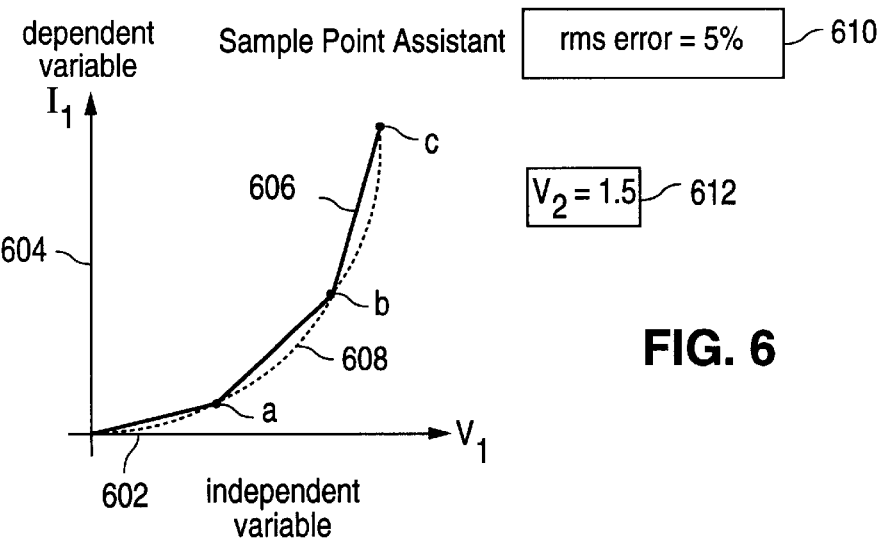
FIG. 6
FIG. 6A
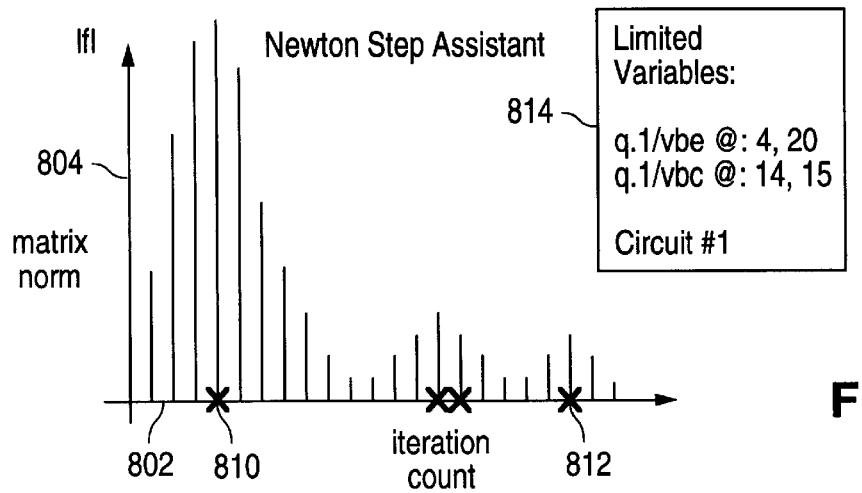
FIG. 8

COMPONENT-BASED ANALOG AND MIXED-SIGNAL SIMULATION MODEL DEVELOPMENT INCLUDING NEWTON STEP MANAGER

RELATED APPLICATION DATA

This application is a continuation-in-part of U.S. patent application Ser. No. 08/602,223, filed Feb. 16, 1996, now U.S. Pat. No. 5,963,724 filed Oct. 5, 1999.

BACKGROUND OF THE INVENTION

The present invention relates generally to the field of computer simulation of analog and mixed-signal circuits and systems. (Modeling of components, circuits or systems generally described in terms of purely discrete time and discrete value systems, commonly known as digital systems, is outside the scope of the present invention.)

Simulation methods and apparatus are useful in increasing design productivity in a wide variety of applications because design defects can be detected prior to construction of the actual apparatus being simulated. Simulation of digital systems has progressed rapidly over the last decade. This growth has been spurred by the development of standard languages such as VHDL and Verilog for modeling digital devices at both the structural and behavioral levels. The former has gained the widest acceptance in large part due to the U.S. Defense Department's mandate that new designs be presented in VHDL form in order that the design be technologically independent. This standardization has allowed companies to invest large resources in the development of models. These models can then be reused and/or sold to allow for rapid prototyping and simulation of new designs, further increasing productivity and efficiency. The same cannot be said in the analog and particularly the mixed-signal arena.

Despite recent progress towards a standard analog hardware description language to facilitate model development, the relative paucity of analog and mixed signal models is still a major barrier to potential increases in design productivity. However, simply increasing the size of model libraries is of limited usefulness, as specific models typically lack portability and reusability. Moreover, since the effective robustness of circuit and system level simulation is determined to a large degree by the model-simulator interaction, simulation tools and modeling tools must be considered together to enable substantial improvements.

The lack of a sufficient quantity and quality of affordable models to adequately represent analog and mixed-signal systems that need to be simulated can be addressed by reducing the expertise required to create robust software components (i.e., models). Presently, model development is done manually and requires significant modeling and computer language expertise. Simulation problems presently are resolved by trial and error adjustment of simulator control settings to find a combination that works for each analysis applied to a design. Moreover, the introduction of a standard description language such as IEEE standard 1076.1 analog extension to VHDL ("VHDL-A") will merely exacerbate these problems if no modeling tools are available and no improvements are made to the simulator. Users will be faced with issues of porting existing models from proprietary languages to VHDL-A. Also, the proposed VHDL-A standard only standardizes the description of a model, not the algorithms and methods used to perform simulation.

In the area of model robustness, intuitive tools are needed to perform model diagnostics that will help the modeler visualize both model characteristics and its interaction with the simulator. Moreover, improvement is needed in tools for configuring model-specific simulation controls. This is presently done on an ad hoc basis where availability of an experienced expert is often a prerequisite to timely success. What is needed is methodology to automate configuration of simulation controls.

When a design calls for a model that is either unavailable or inadequate, it is useful for designers who are typically model users to have modeling tools that are simple enough to create or adjust models to meet an immediate need. It is also useful for model suppliers to have adequate modeling tools to create or repair models more efficiently. Presently, the lack of adequate modeling tools makes this a labor intensive process because focus must be placed on implementation details rather than model requirements. As a result, the modeling test takes too long and the quality of the completed model is sacrificed.

The earliest model creations paradigm was strictly text based, requiring the user to specify topologies and mathematical relationships in a strictly defined syntax, for example in early versions of SPICE. Recently, others have suggested removing the language or programming barrier by developing an environment that is a purely graphical model description for analog and mixed signal models. Even this approach fails to provide the flexibility and ease-of-use necessary for efficient model creation.

In the area of simulation robustness, the need remains to provide tools that allow a non-expert user to improve simulation performance and identify and resolve simulation problems. New tools that assist in locating and analyzing the cause of simulation failures will lead to improved efficiency in the overall design process.

SUMMARY OF THE INVENTION

Present analog and mixed-signal development systems are inadequate in three, related areas: model creation, model robustness and simulation robustness.

One of the present difficulties in model creation is that it requires experience and proficiency in the underlying description language. Model creation can be facilitated by providing model creation tools that are easier to use. One object of the present invention is to streamline the process of developing analog and mixed signal models.

Another object of the invention is to create a model development environment that better supports model portability and reusability.

A further object is to reduce the user expertise required to create robust simulation models.

Yet another object is to provide intuitive tools for performing model diagnostics that will help the modeler visualize both model characteristics and its interaction with the simulator.

A further object is to improve simulation robustness, by providing tools that allow a non-expert user to improve simulation performance, identify and resolve simulation problems. New tools that assist in locating and analyzing the cause of simulation failures will lead to improved efficiency in the overall design process. In describing the invention, we will use the terms defined in the following Glossary. These brief definitions are solely for the convenience of the reader, and are subject to the more complete discussion that follows.

GLOSSARY

Analog
An analog component, circuit or system is one whose behavior is generally described as continuous in time but which may have continuous or discrete values. Examples include a motor or a switched-capacitor filter.

Condition Number Analysis
A sensitivity analysis that allows the user to trace back errors in a simulation to the model instance(s) which have the most significant contributions. This is a feature of the Matrix Viewer.

Matrix
A numerical representation of a system of equations used in simulation for executing a given model. The matrix is a rectangular array of cells, each cell having a numeric value or symbolic expression. Matrix cell values change with each iteration of the simulation algorithm.

Matrix Viewer
An interactive, graphical tool for studying a matrix. In the matrix viewer screen display, a selectable portion of a matrix is displayed, and displayed matrix cells can be selected to obtain more detailed information, e.g., an analysis of what elements contribute to the numeric value of the selected cell.

Mixed-signal
A mixed-signal component, circuit or system is one whose behavior is generally described as a combination of a discrete time circuit or system and a continuous time circuit or system. Its behavior may be expressed in terms of continuous or discrete values. Examples include an analog-to-digital converter or a digital-to-analog converter. Both analog and mixed-signal systems can exist in any technology or mixture of technologies, such as electronic, electrical, mechanical, optical, hydraulic, electromechanical, electro-optical etc.

Model Database
A set of data structures and interface protocols that manage and store modeling information that defines one or more models.

Model Editor
An interactive tool for creating or editing a model of an analog or mixed-signal system for use in developing, analyzing, documenting or simulating the modeled system. Models are made up of an arbitrary number of hierarchical levels of associated sub-models.

Newton Step Manager
An interactive, graphical tool for identifying and studying non-linear dependencies in a model. The Newton Step Manager collects and displays selected matrix data generated during a simulation of a model, and allows a user to visualize the effects of Newton steps in the simulation and interactively assign them to the model.

Parameter
A facet of a model that has a value that generally is held constant during a particular simulation. For example, parameters can include capacitance, temperature, voltage gain, etc. Merely changing a parameter value, for example, 240 microfarads, 44 degrees C. or 650 (voltage gain) does not change the model. Rather, it is part of creating a particular instance of the model.

Parameter Manager
An interactive tool for inspecting and specifying valid operating regions, default values and descriptions of parameters in a model.

Sample Point
A selected value of an independent variable at which the value of a dependent variable is determined in connection with a piecewise linear approximation of the dependency.

Sample Point Assistant
An interactive, graphical tool for identifying non-linear dependencies in a model, and for selecting, inspecting and modifying a series of sample points for a selected non-linear relationship.

Stamp (or Model Element Stamp)
A stamp, like a matrix, can be displayed as a rectangular array of cells, each cell having a respective value which can be symbolic, real or complex. Each stamp corresponds to, and defines, a particular instance of a model, including parameter values for that model instance. A stamp can change from one iteration of the simulator to another.

One aspect of the present invention comprises a new model development environment—including a suite of interactive tools—to assist users in the development, testing and evaluation of analog and mixed-signal simulation models. These graphical, interactive tools do not require user expertise in a particular hardware description language, or indeed any computer programming expertise at all. Moreover, the new tools enable a user to investigate and refine a model without having simulation modeling expertise.

These new tools insulate the user from the complex world of simulation execution and hardware description programming. Instead, the invention provides means for extracting essential information and presenting it to the user in ways that make simulation modeling work more intuitive, and provide tools to investigate simulation robustness, and model robustness, in an interactive, graphical environment.

Operation in the new environment is summarized in a flowchart of FIG. 18. Referring to FIG. 18, the user invokes a new "Model Editor" 1802 to read in an existing model or to create a new one. The user enters relationships or formulas in the equation editor and assigns them to symbols in the topology editor, 1804. Or, symbols can be interconnected as desired on the topology editor and relationships later supplied in the equation editor. Relationships can be hidden for screen efficiency, 1806. The equation editor and topology editor display windows are cross-coupled so that selecting a symbol highlights the corresponding relationships in the equation editor, and conversely selecting an equation or instance highlights the corresponding symbol in the topology editor, 1808. The model editor further includes parameter management tools to provide a simple graphical interface for managing equation parameters. Models or portions thereof that are reused donate the parameter management data to the new model, 1810.

Following editing and parameter management, the user can perform model robustness and verification as needed. Sample point manager, Newton step manager and matrix element stamp analysis are all new, interactive tools that provide a graphical, relatively intuitive environment to aide these efforts. The sample point manager provides guidance in selecting sample points by displaying dependencies and showing error estimates for a proposed set of sample points for a selected dependent variable. The Newton step manager captures and analyzes Newton step limiting in a simulation, and gives the user a quick and easy means for inserting or changing Newton step values, and then shows the effects of the changes.

Another aspect of the invention, largely for debugging following simulation, comprises several simulation robustness tools, namely a matrix viewer tool and a stamp viewer tool. Simulation robustness tools allow the non-expert user to improve simulation performance, and identify and resolve simulation problems. Simulation problems need no longer be resolved by laborious trial and error. The matrix viewer is essentially a matrix display and manipulation tool. It provides a novel way to link the numerical properties of the system matrix to the models at hand, and provides an interactive environment to aid the user in evaluating new algorithms or debugging simulation problems with greater facility.

In the matrix viewer, a mouse click reveals the stamps that contribute to a selected cell of the matrix, the contributors having been sorted in order of contribution. A further mouse click on one of the listed stamps opens a stamp viewer window, in which the stamp itself is displayed. A further mouse click on one cell of the stamp invokes the model editor to show the relationship and topology symbol that contribute to the selected stamp cell. A matrix manipulation process allows a user to remove a stamp from the matrix cell contributor list, and immediately see the effect of the change in an updated matrix display. The user can select back annotation of the modified matrix to the appropriate schematic automatically. Another robustness tool provides condition number analysis to see the effects of perturbing each non-zero cell in the matrix.

The various processes and "tools" described herein preferably are implemented in software for use in a suitable digital computer or workstation. Since some of these processes are interactive, it is assumed that the workstation is equipped with appropriate video display apparatus and input hardware including a keyboard and pointing device such as a mouse, pointing stick, trackball or the like. The particulars of the workstation hardware are not critical.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 6 Sample Point Assistant sample screen display graph

FIG. 6A Sample Point Assistant pull-down menu example

FIG. 8 Newton Step Manager sample screen display

DETAILED DESCRIPTION OF THE PREFERRED EMBODIMENT

I. Mixed Signal Modeling and Simulation System Overview

A. Introduction

Figure 1:
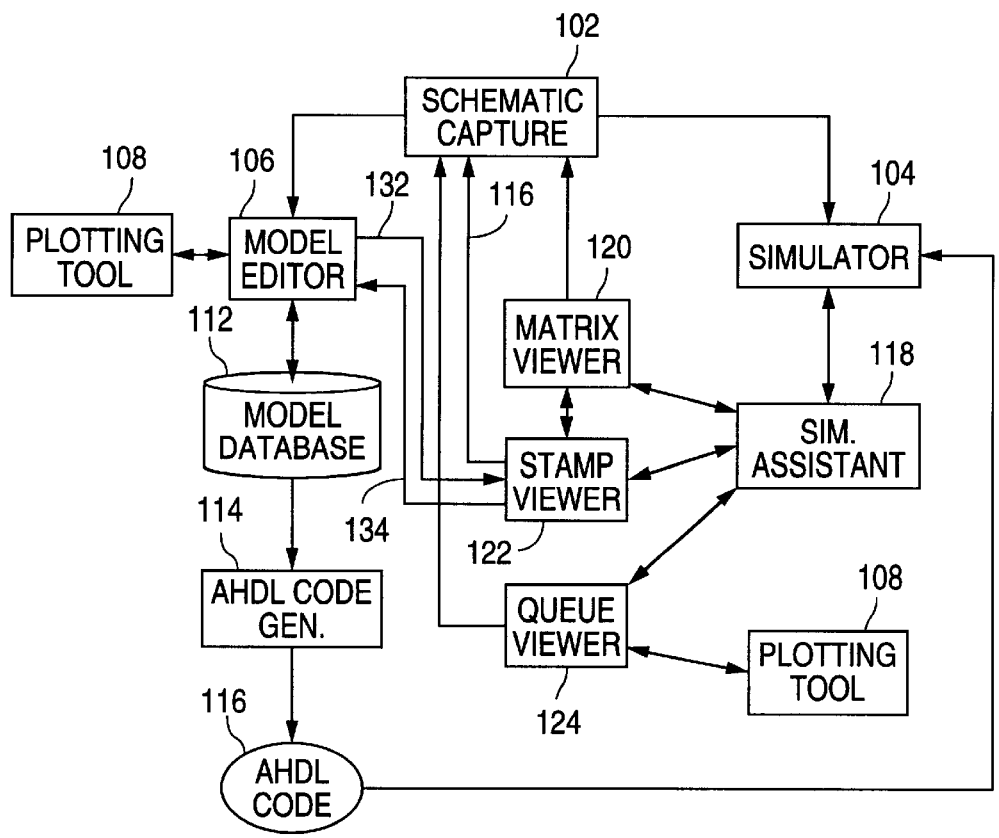
FIG. 1 Overall modeling and simulation system block diagram

FIG. 1 is a block diagram showing an overview of an analog and analog/digital mixed-signal modeling and simulation system according to the present invention. In FIG. 1, a Model Editor tool, i.e., a software process, 106 is provided to read in an existing model, for example from a machine-readable storage medium such as solid-state memory, disk or tape, or to enter a new model of a physical system to be modeled. Model editor 106 may be invoked in a stand-alone mode or from within a schematic capture system 102. The model editor 106 interacts with a plotting tool 108 for creating graphical screen displays as further described later. The model editor 106 is coupled to a model database 112 in which data comprising one or more models is stored. Data comprising a model is made available to an analog hardware description language ("AHDL") code-generator 114 for generating AHDL code 116. The resulting AHDL code 116 in turn is input to a simulator 104 for simulating the model system, i.e., "executing" the model. The simulator per se is known and is not part of the present invention. A Simulation Assistant process 118 provides interaction with the simulator and collects results of the simulation. More specifically, the Simulation Assistant translates data requests from the various simulation and modeling tools described herein into simulation commands, runs the simulator, and extracts the simulation results in various forms. A Matrix Viewer tool 120 and a Stamp Viewer tool 122, each further described below, interacts with the Simulation Assistant 118 for inspecting the simulation matrix and modifying the model.

Figure 2:
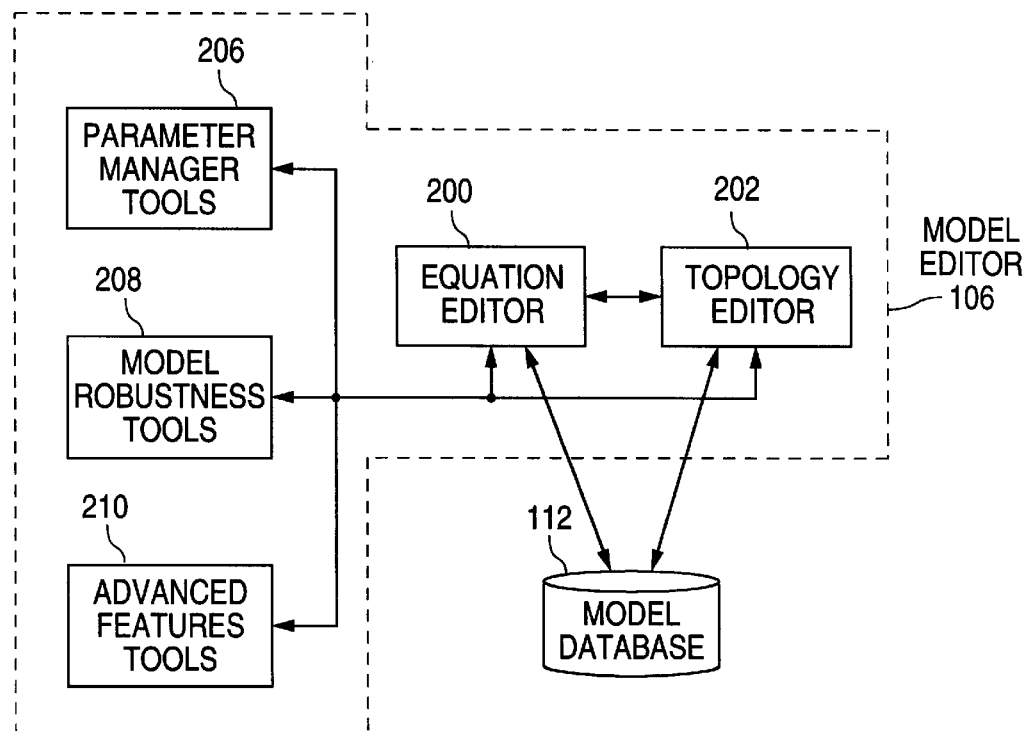
FIG. 2 Model Editor process block diagram

Certain aspects of the simulation system of FIG. 1 are known individually or in other contexts in the prior art. Known simulation systems include a schematic capture tool 102, plotting tool 108, code generator 114 and use of AHDL code 116 in a simulator 104. A queue viewer 124 also is known in the prior art. Two important aspects of the present invention are the model editor 106 and model database 112. The model editor presents important advancements in model creation for circuit and system simulation applications. For example, it allows a user to (1) enter differential-algebraic equations for continuous-time modeling, event schedulers and handlers for discrete-time modeling, and graphical topology in a single integrated environment; (2) to perform the tasks of (1) in a hardware description language-independent fashion; and (3) to integrate parameter management, model robustness tools and other advanced feature tools to the modeling process as further described below. The new model editor allows a user with essentially no knowledge of the underlying hardware description language to rapidly create and/or modify models as necessary. The model editor works together with the model database, further described later. FIG. 2 illustrates features of the model editor 106 in greater detail.

B. Model Database

Figure 19:
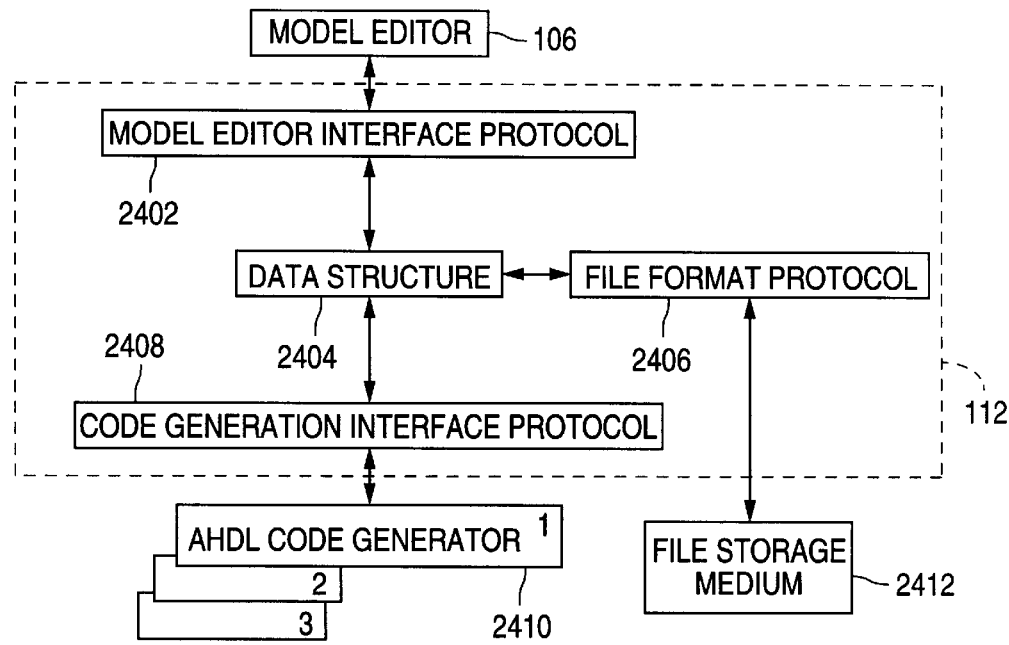

The model database 112 also is novel. This "data container" is arranged to store model information in such a way that several different modeling languages can be supported from a single modeling environment. The model database comprises a set of data structures and interface protocols that manage and store the modeling information input by a user in the Model Editor. This model information comprises model equations, graphical symbol data, sample points, Newton steps, parameters and associated items, each described in further detail below. Referring to FIG. 19, the model database 112 includes a Model Editor Interface Protocol 2402 which manages how modeling information is captured from the Model Editor 106 and stored in the defined data structures 2404. Protocol 2402 also performs the reverse operation of taking data from the data structures 2404 and putting it into a form suitable for representation in the Model Editor. The data structures 2404 are persistent in the event that a user decides to save a model (partial or complete) in that these data structures are written out according to a predetermined file format protocol 2406. This protocol 2406 supports both saving and retrieving the data to a selected file storage medium 2412. Another protocol, the Code Generation Interface Protocol 2408 supports the AHDL code generation process by mapping the model data into a form suitable for code generation. The code generator, e.g., AHDL Code Generator 2410 creates an AHDL description using the proper language syntax and capabilities. Other code generators (1,2,3) can be used, each designed to generate code in a specific hardware description language implementation for use with a corresponding target simulator. In this environment, the user of the Model Editor 106 will not have to be concerned with the details of any particular language implementation when creating or editing a model.

II. Model Editor

FIG. 2 is a functional block diagram showing greater detail of the model editor tool 106 of FIG. 1. The model editor includes an equation editor 200 and a topology editor 202 which are interconnected so as to operate cooperatively for creating or editing a model stored in model database 112. The model editor also includes parameter manager tools 206, model diagnostics or "robustness" tools 208 and advanced features tools 210. Each of these software tools is described later.

To create a model, a user begins by entering relationships in the equation editor 200 and assigning them to a symbol in the topology editor 202; or by connecting together various symbols in the topology editor and later specifying the equations or other relationships that describe those symbols using the equation editor 200. These relationships can take the form of an analog relationship, event-driven statement or a mixture of the two types of relationships. These symbols and associated relationships are stored as data forming a section of the model in the model database 112. The parameter manager tool 206 provides a convenient means for assigning and modifying model parameters as further described later with reference to FIG. 9. The advanced features tools 210 will be described later as well. The model robustness tools 208 are described in Section II(C) below.

A. Equation Editor

Figure 3:
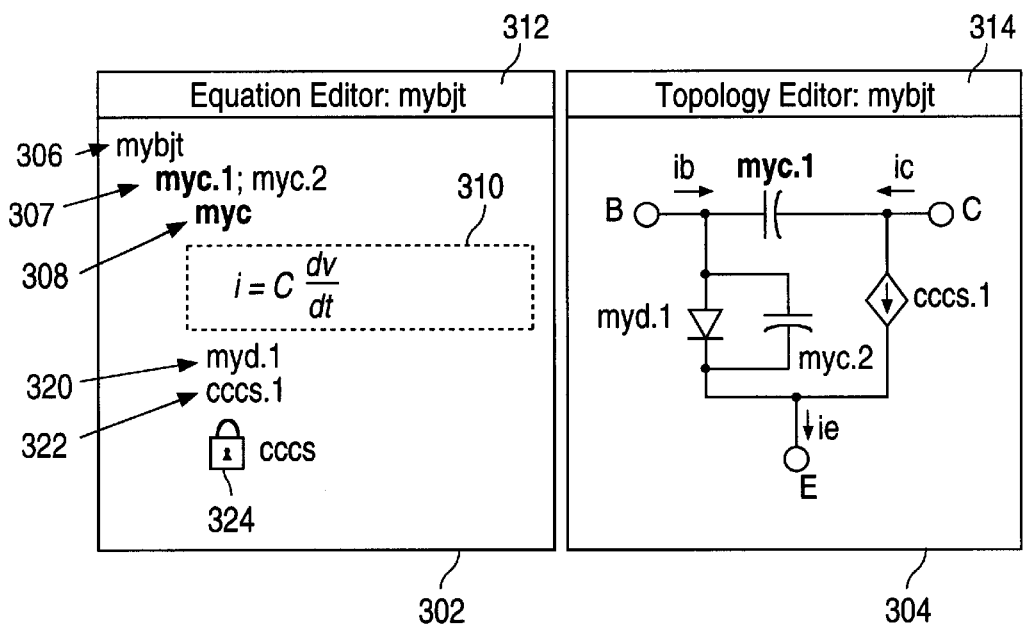
FIG. 3 Model Editor sample screen display

Operation of the model editor 106 is further illustrated by way of a sample screen display in FIG. 3. FIG. 3 shows an equation editor window 302 and a topology editor window 304. Screen display windows can be generated using known graphical user interface technology, e.g., in the Microsoft Windows® environment, Macintosh®, etc. These could be displayed in separate, overlapping or non-overlapping windows or within a common window for simultaneous display. The equation editor window 302 allows the user to input and edit equations using common format and symbols as are well known in engineering and mathematics, such as the use of Arabic numbers, Greek letters and mathematical operators including, for example, derivative and integral operators. A graphical user interface of the known type in which a mouse or other pointing device is used for selecting text or other display objects is preferred.

To illustrate, the equation editor window 302 in FIG. 3 has a title bar 312 that identifies the tool and model name, "mybjt"—a bipolar junction transistor model. This model of course may be part of a larger model that includes one or more bipolar transistors to be modeled in the manner shown. Inside the window 302, the equation editor display is arranged in hierarchical fashion, in which a triangle 306 is used to indicate the presence of a next lower level of the hierarchy. Other symbols, for example a plus sign (+), can be used to the same effect. Thus the model name "mybjt" serves as the name of a directory or folder of files. Clicking on the symbol 306 or the name selects it for display of the next level of the hierarchy. Selection of a particular directory can be indicated by a visual cue such as rotation of the corresponding symbol as shown in window 302. Selection of a model in the equation editor window displays the associated sub-models. Conversely, de-selection (e.g., by clicking an already selected model) hides the sub-models. Menu selections for "collapse" or "expand" can be used in the same vein.

In FIG. 3, the model mybjt is selected and window 302 consequently displays the three types of associated sub-models or elements within this particular model, namely capacitors (instances myc.1 and myc.2), a diode myd.1 and a current source cccs.1. Selecting the capacitor list by clicking triangle 307 displays the capacitor model myc, in this case an equation shown in dashed box 308, namely I=C (dv/dt). The current source instance eccs.1 322 is selected but the model itself, cccs, is not available to this user so a symbol (here a closed padlock icon 324) is displayed to convey that condition. The user is free to edit displayed models, e.g., myc, and the equation editor will make the corresponding changes in the model database 112. Thus the user can change the underlying models without "speaking" any particular HDL language or having any particular programming expertise.

Equation editors known in the prior art function differently to achieve a different result. Typically, what is referred to as "model editing" actually involves modifying the values of previously-defined input parameters to make an existing model behave differently. Such editors do not change the actual model—they only change the coefficients to the equations that define the model in order to produce different simulation results. The model itself is not affected. Previously, the only method of changing an AHDL-based model was to edit it with a text editor, much like a programmer edits a computer program. An important feature of the new model editor 106 is to provide a user interface to the model itself at a much higher level of abstraction than that of editing the actual AHDL code. This will reduce a user's dependence on experienced programming experts for model development or modification. In this new environment, the model editor operates on model equations, topologies, parameters, etc. independently of language implementation. This language-independent representation of the model is stored in the model database 112. As mentioned with reference to FIG. 1, a language specific code generator 114 then generates the AHDL code 116 for subsequent execution in a simulator 104. The equation editor is "cross-linked" to the topology editor, described next.

B. Topology Editor

Topology editors are known in the prior art. However, an important new feature of the present invention lies in the connections between the new equation editor 200 and topology editor 202 and how these editors interact. One such connection provides graphical "cross-linking" between the equation editor display window and the topology editor display window. To illustrate, FIG. 3 shows a screen display comprising an equation editor window 302 and a topology editor window 304. These screen displays illustrate a circuit topology and associated mathematical relationships for modeling a bipolar junction transistor as noted above. The two display windows are linked as follows. The circuit topology shown in window 304 is displayed in response to user selection of the model "mybjt" in the equation editor window, for example by clicking a pointing device at the triangle symbol 306. While examining the circuit topology in window 304, the user may select a particular circuit element, again using a pointing device, for example the capacitor symbol labeled myc. 1, which is highlighted when it is so selected as shown in the drawing. When the myc.1 symbol is highlighted in window 304, the corresponding model that governs the operation of that element is highlighted in the equation editor display window 302. In this example, the dashed box 310 highlights the applicable capacitor model equation myc. Conversely, a user can select the myc model by clicking on the corresponding triangle icon 308 in the equation editor window 302. In that case, the topology editor highlights all of the circuit elements that are instances of the selected model, i.e., capacitors myc.1 and myc.2 in the topology editor display window 304.

Thus there are two instances of this model myc in the model mybjt that is being created or edited in this session, instances myc.1 and myc.2. While these two instances have the same underlying model equations—myc (308) (but perhaps different parameter values, i.e., capacitance C), they are handled by a list of instances such as the second line 316 in the equation editor screen display. If the user desires to make one instance a different model, the selected instance can be split off of the same line since they will no longer both have the same underlying model called myc. The equations associated with the p-n junction myd.1 are collapsed to manage use of the screen. The triangle icon 320 provides a visual cue that these equations are available for display. The element labeled cccs.1 appearing both in the circuit of window 304 and listed in the equation editor display window 302 is an encrypted or proprietary model that is not viewable by the user. When the user attempts to open this object by selecting triangle 322, the triangle rotates to point downward to indicate that selection, and another icon 324 is displayed indicating that the object cccs is locked.

Referring again to the capacitor object myc.1, the parameter identified in the corresponding equation myc is the capacitance C. The parameter manager (described later) is used to define an acceptable range of values for this parameter, a default value, a descriptive comment, and the actual capacitance value to be used in a pre-simulation analysis such as model robustness checks.

C. Parameter Manager Tools

Figure 9:
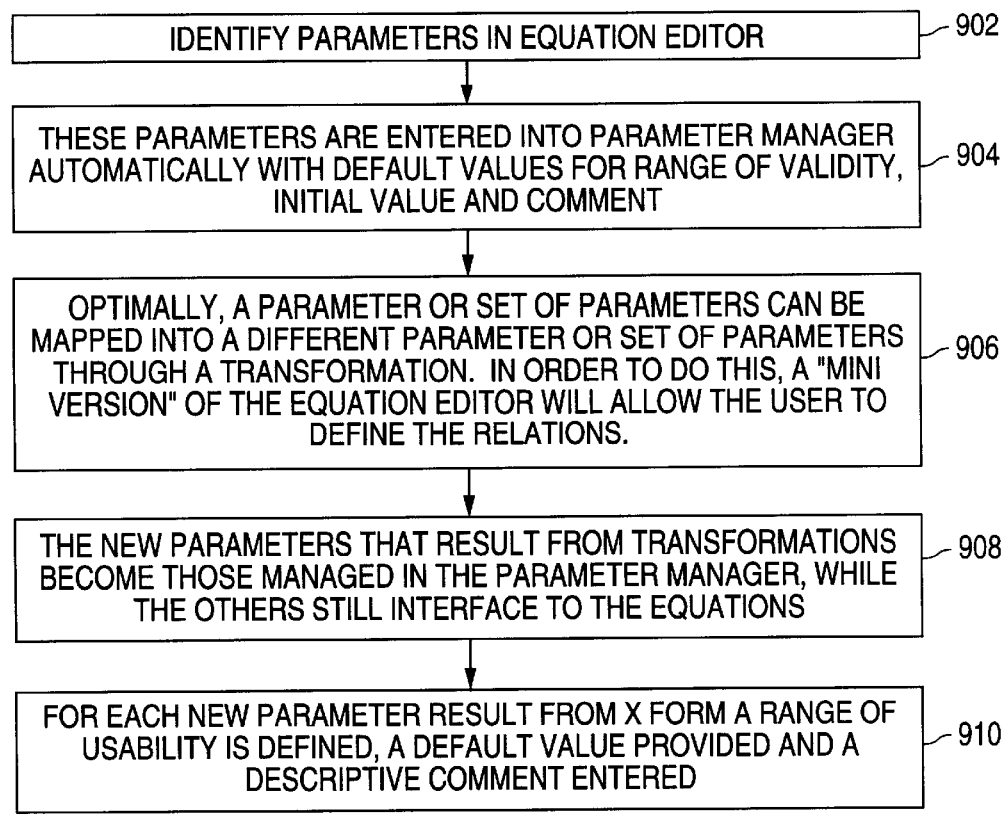
FIG. 9 Parameter Manager procedure flowchart

The new model editor 106 also includes a parameter manager tool (206 in FIG. 2) as noted above. A parameter is a facet of a model that has a value that generally is held constant during a particular simulation. Changing a parameter definition, or introducing a new parameter, changes the model. Merely changing a parameter value does not change the model. Rather, it is part of creating a particular instance of the model. FIG. 9 is a block diagram illustrating the parameter management tool process in a presently preferred embodiment. In general, the parameter manager provides for convenient specification of valid operating regions, default values and a brief description for parameters used in models. The parameter manager can be used for specifying operating parameters, independent variables, values and numbers. The parameter manager allows the user to inspect and modify various operating parameters without necessarily being familiar with any particular hardware description language. The parameter manager thus represents another feature of the invention directed to providing easy access for creating and modifying the model as may be necessary. In use, the user begins by identifying one or more parameters by selecting them in the equation editor. Parameters of interest can be selected in the equation editor screen display window (302 in FIG. 3). In many cases, fast and convenient parameter selection can be achieved indirectly by first selecting a symbol in the schematic diagram shown in the topology editor screen display window 304. It will be recalled that a symbol selection in the topology editor automatically selects (and visually "highlights") the corresponding equation in the equation editor. So, for example, "clicking" on the capacitor myc.1 in the topology editor results in selection of the corresponding equation myc 310 in the equation editor. Then double-clicking on the equation, for example, or selecting parameter management from a menu, brings up the parameter manager with the corresponding parameter— capacitance C in the example—selected for inspection or modification. If C has not been defined previously, the tool can initialize it as a new parameter.

Model creation (and modification) is distinguished from model characterization. The latter refers to the process of assigning values to the parameters in a model such that the model represents a known physical system. In other words, a general model is characterized to a particular physical system. "Model creation" on the other hand is the process of creating and evaluating the general model of a physical system. For example, one might create a general model of a bipolar NPN transistor, using the tools described herein, and then characterize that general model to the 2N2222A NPN transistor specifically.

The selected parameters are automatically entered into the parameter manager process with default values for range of validity, initial value and comment. The user is free to change these values, for example by editing them in a screen display of the type illustrated in FIG. 10. The parameter manager automatically generates AHDL code necessary to enforce the range of validity defined by the user. Thereafter, when the model is run in the simulator, if a parameter value is specified outside this defined region of validity, a warning or error message can be provided to so indicate.

Figure 10:
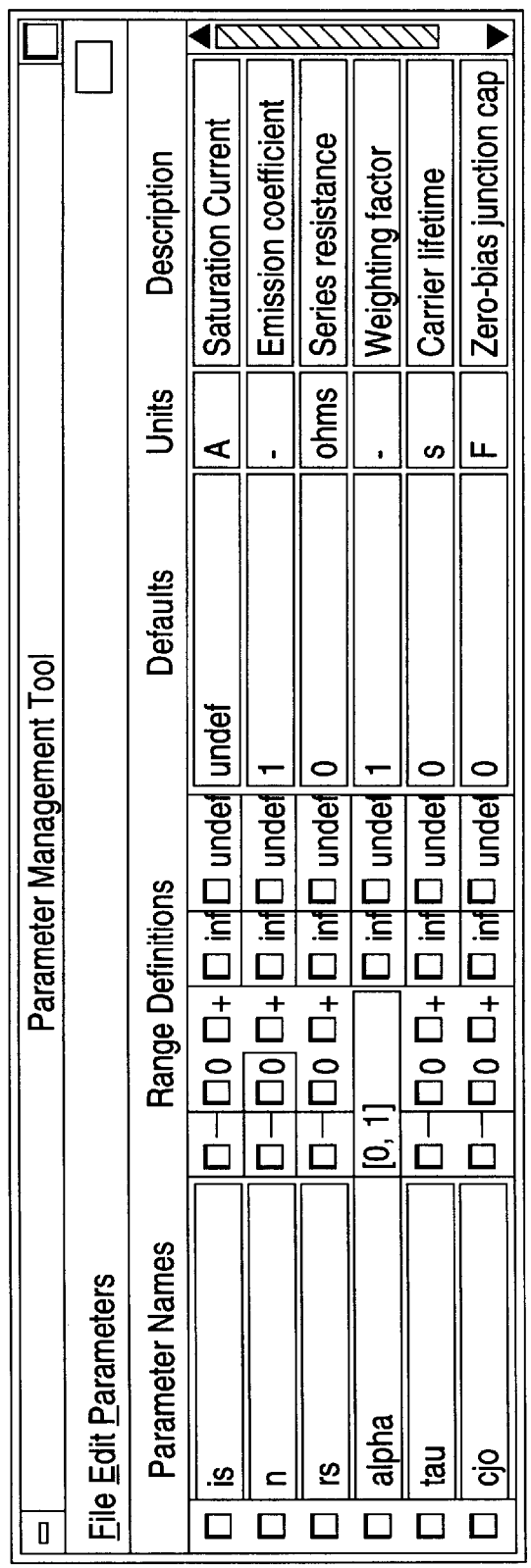
FIG. 10 Parameter Manager sample screen display

FIG. 10 is an example of a parameter manager tool screen display. The display shows various parameters in tabular form, with one row of the display for each parameter. The columns indicate parameter name, range definitions, default value, units and description. Under the range definition area, there are five "buttons" that respectively indicate the allowable values of a numerical parameter:

(−) negative
(0) zero
(+) positive
(INF) infinite
UNDEF undefined

The user simply clicks on one or more of the buttons as appropriate. For example, if a particular parameter is allowed to assume only zero or a bounded, positive value, then the zero (0) and positive (+) buttons are toggled on in the display of FIG. 10.

D. Parameter Mapping

An additional feature of the present invention provides for mapping a parameter or set of parameters into a different parameter or set of parameters through a selected transformation. To define a desired transformation, the user can employ a version of the equation editor to define the necessary relations. For example, parameters may be resistance, temperature, temperature coefficient, voltage, etc. or dimensions of a mechanical object, the values of which are usually held constant during a particular simulation. The transformation features can be used to convert parameters into forms that are more meaningful or intuitive to the user than the form actually used in the simulation. For example, the decibel (dB) is commonly used as a measure of sound pressure. It is a logarithmic function, however, and few people have an intuitive "feel" for sound level expressed in decibels. In some applications, it will be more useful to convert sound pressure into say an arbitrary "sound level" scale using numbers say from 1 to 10. To use this feature, the user would invoke the equation editor, and use it to define a mathematical relationship for a transformation from decibel to "sound level" as desired. The new parameters that result from the defined transformation will appear in the screen displays such as FIG. 10 and are used in the parameter manager. The parameter manager uses these transformations in the background so that the more intuitive units and values are displayed in the parameter manager for those parameters that have transformation associated with them. For each transformed parameter, a range of usability is defined, a default value provided and a descriptive comment entered in that field.

III. Model Robustness Tools

Figure 4:
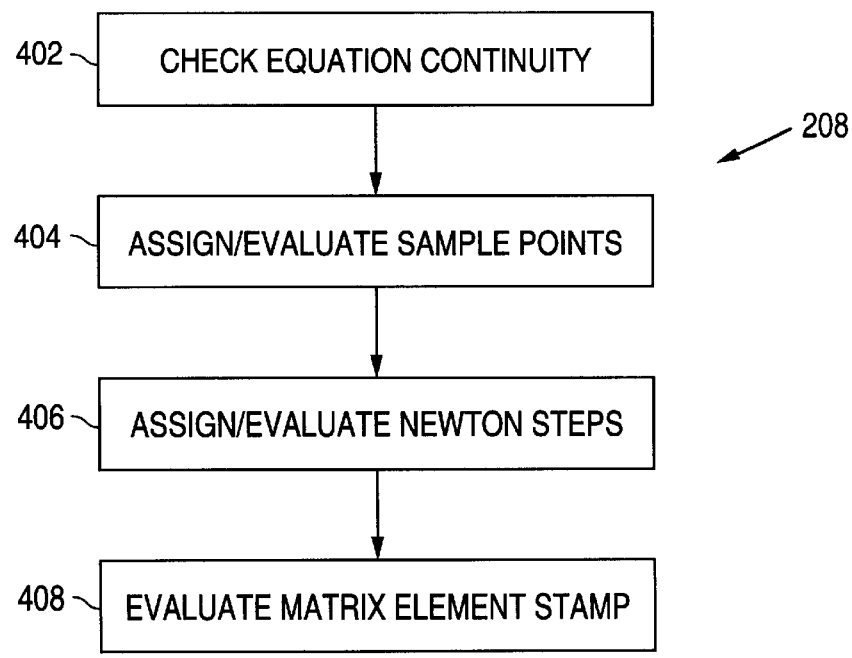
FIG. 4 Model Robustness evaluation procedure flowchart

As indicated in FIG. 2, the model editor 106 includes the equation editor, topology editor and parameter manager tools described above, along with additional features including model diagnostics or "robustness" tools 208. The flowchart of FIG. 4 illustrates generally a model robustness evaluation process according to the present invention. The model robustness evaluation process comprises checking equation continuity 402, assigning/evaluating sample points 404, assigning and/or evaluating Newton steps 406, and analyzing matrix elements stamps in step 408. Checking equation continuity is known in the prior art and need not be described in detail. New methods of assignment and evaluation of sample points are described next with reference to FIG. 5.

A. Sample Point Management

Figure 5:
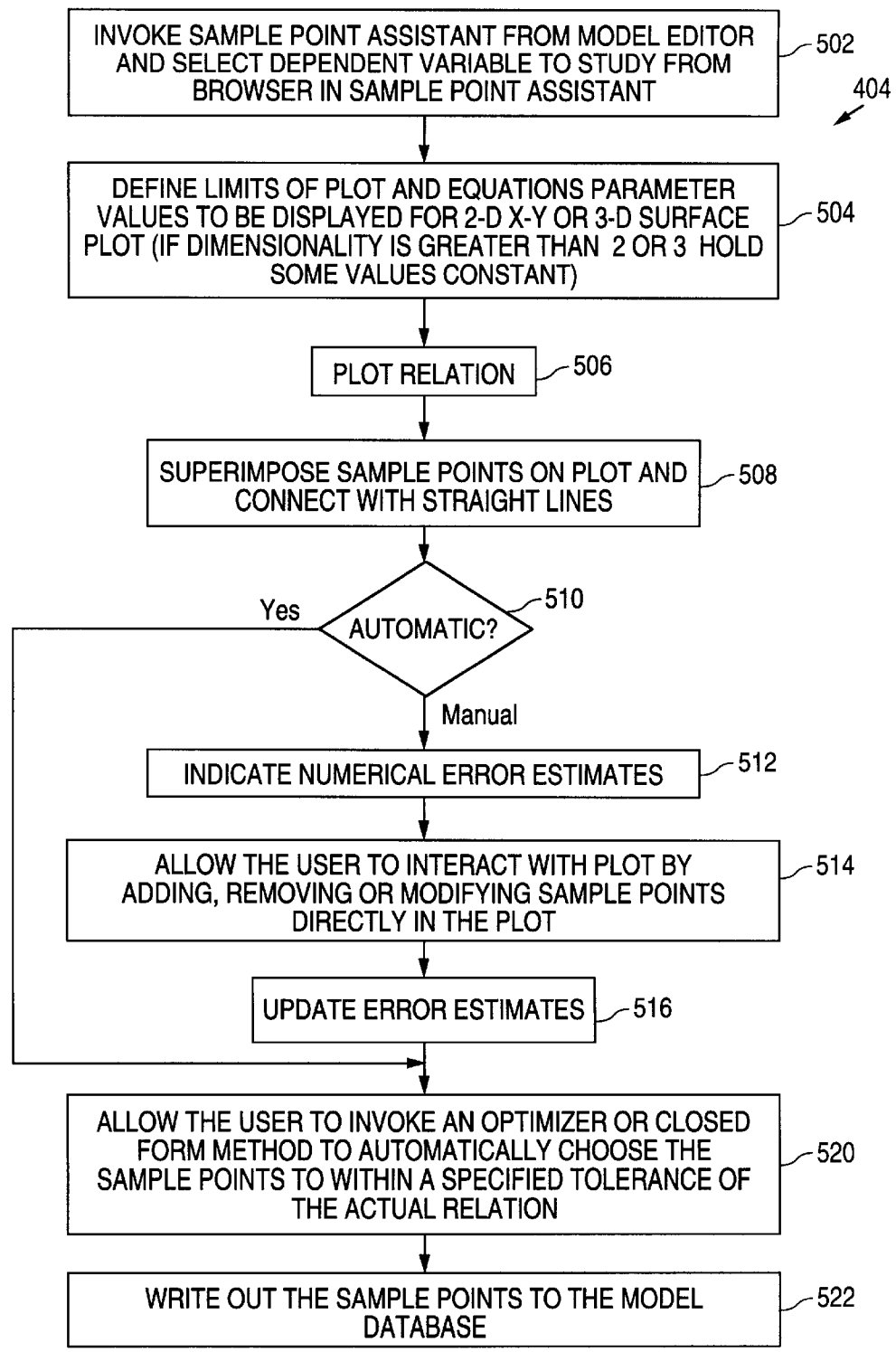
FIG. 5 Sample Point Assistant procedure flowchart

The flowchart of FIG. 5 illustrates a sample point management process as follows. The process of FIG. 5 begins by selecting a model equation to study in the model editor. As noted above with reference to FIG. 3, equations can be selected in the equation editor display or indirectly through the topology editor display. The process of FIG. 5 begins, step 502, with invoking the "sample point assistant" process from the model editor, for example using a pull-down menu, and selecting a dependent variable to study. Upon invocation, the sample point assistant will analyze the model's nonlinear dependencies and display them in a list or "browser." There the user selects a nonlinear dependency (dependent variable) that he wishes to study from a sample point perspective. The sample point assistant software allows the user to focus on the nonlinear relationships within the model he/she is creating rather than sifting through programming code.

The sample point manager process proceeds as follows. Step 504 calls for defining the limits of a plot to be created and equation parameter values to be displayed in a two-dimensional x-y or three-dimensional surface plot. If dimensionality is greater than 2 or 3, the user can select one or more values to be held constant for the plot. In step 506 the defined relation is plotted using the plotting tool (108) for screen display and/or hard copy printout. It is known in prior art to approximate a curve or mathematical relationship by dividing it into piece-wise linear segments. While it is known to use the concept of sampling points in modeling simulation, the problem of selecting and modifying sample points effectively has been heretofore addressed by trial and error. The present invention sample point manager is a visualization tool that facilitates sample point selection, inspection and modification in an interactive, graphical mode.

The process of FIG. 5 continues in step 508 by superimposing a selected set of sample points onto the previously defined plot, and interconnecting the sample points with straight line segments. See FIG. 6. This initial set of sample points may be determined by a predetermined default set of sample points, or the simulator may be invoked to generate an initial set of sample points. A decision 510 permits the user to select either automatic or manual methods for modifying the sample points. If the user selects manual operation, the system next provides in step 512 an indication of numerical error estimates. Next, the sample point management tool allows the user to interact with the plot by adding, removing or modifying sample points in step 514, preferably using a mouse or other pointing device for interacting with the plot. Error estimates are updated automatically in step 516 responsive to the modified set of sample points, and the screen display updated accordingly.

FIG. 6 illustrates a graphical screen display according to one possible implementation of the sample point management tool for single dimensional dependencies. In FIG. 6, the plot comprises axis 602, associated with an independent variable V1, and an orthogonal axis 604 corresponding to dependent variable I1, selected by the user. Sample points a, b and c are used to form a piece-wise linear approximation 606 of a continuous waveform 608. The more dense the sample points are for a given variable, the more closely the "sampled" equations approximate the actual equations as written in the model. While the selection of sample points appears fairly straightforward, experience has shown that poor selection of sample points is a common source of simulation convergence problems. This new method of visualizing and interactively assigning sample points is desired so that the effects can be observed.

The display of FIG. 6 thus identifies the sample points, and provides for viewing of evaluated and simulated waveforms from within the same viewer so that the error can be measured and displayed. This error may be, for example, an rms error over the range selected, or expressed as a percent difference between the two curves at a given value of the independent variable or the dependent variable. For example, the plot of FIG. 6 shows an error indication 610 as an rms error (5%) for the set of sample points currently selected. A display element 612 also indicates the value of a second independent variable being held constant ($V_2$=1.5) during study of the first variable. The sample point assistant thus allows the user to observe and modify the sample points assigned to a nonlinear relationship while basing his judgments on numerical error estimates.

If the user selects automatic operation at decision 510, an optimizer or closed-form methodology is invoked to automatically choose the sample points to within a specified tolerance of the actual relation, step 520 in the flowchart. The sample points thus selected are displayed for example as illustrated in FIG. 6, and again the user is free to interactively modify the proposed set of sample points, as described above. The user also is free to invoke multiple instances of the sample point manager, for displaying additional dimensions or variables at the same time, to provide for visualizing the influence of a given variable on other dependent variables which may be effected, directly or indirectly. FIG. 6A illustrates one example of a pull-down menu in the sample point manager for selecting various sample point management operations. The menu items are self-explanatory in this context. Once the user is satisfied with the sample point assignments, the sample points are written out to the model databases, step 522. ("Save to DB" in the pull-down menu of FIG. 6A.) These features contribute to the broad goal of the invention of assisting a non-expert with new model development and existing model modification without requiring a proficiency in the underlying AHDL.

B. Newton Step Assignment and Evaluation

Circuit simulators sometimes fail to converge to a solution when solving the nonlinear system of equations. If the convergence failure is due to properties associated with a model, Newton step limiting can often be successfully employed to control the simulator's convergence process. Newton step limiting uses knowledge of the model's relationships to control the simulator's behavior during these periods of instability. Newton limiting (or Newton steps) is generally referred to as a model-based simulation control on the Newton-Raphson algorithm. Once employed, Newton steps prevent the simulator from guessing values for the model's independent variables that would cause large excursions and lead to non-convergence.

As indicated with reference to FIG. 4, the model robustness evaluation process includes assignment and evaluation of Newton steps 406. Digital computer simulation generally involves iterative solutions of a system of equations. Such a system of equations is represented as a matrix which in turn can be viewed as a rectangular grid of cells, each cell corresponding to a particular location (row and column) of the matrix. Numerical properties of the matrix, for example various norms and condition numbers, are important indicators of convergence of the simulation. Newton steps, or Newton limiting, is one remedy for simulation convergence problems. Newton steps are model-specific numerical limits that prevent the Newton-Raphson algorithm from taking a step that is larger than the specified limit from one iteration to the next. Newton steps are a very powerful algorithm convergence aid for nonlinear models. They are employed in Newton-Raphson-based simulators such as SPICE. While Newton steps are often necessary in non-linear modeling, no general theory for their selection exists. The present invention addresses this need by providing means for measuring and visualizing the effective Newton steps and interactively assigning them to a model.

Figure 7:
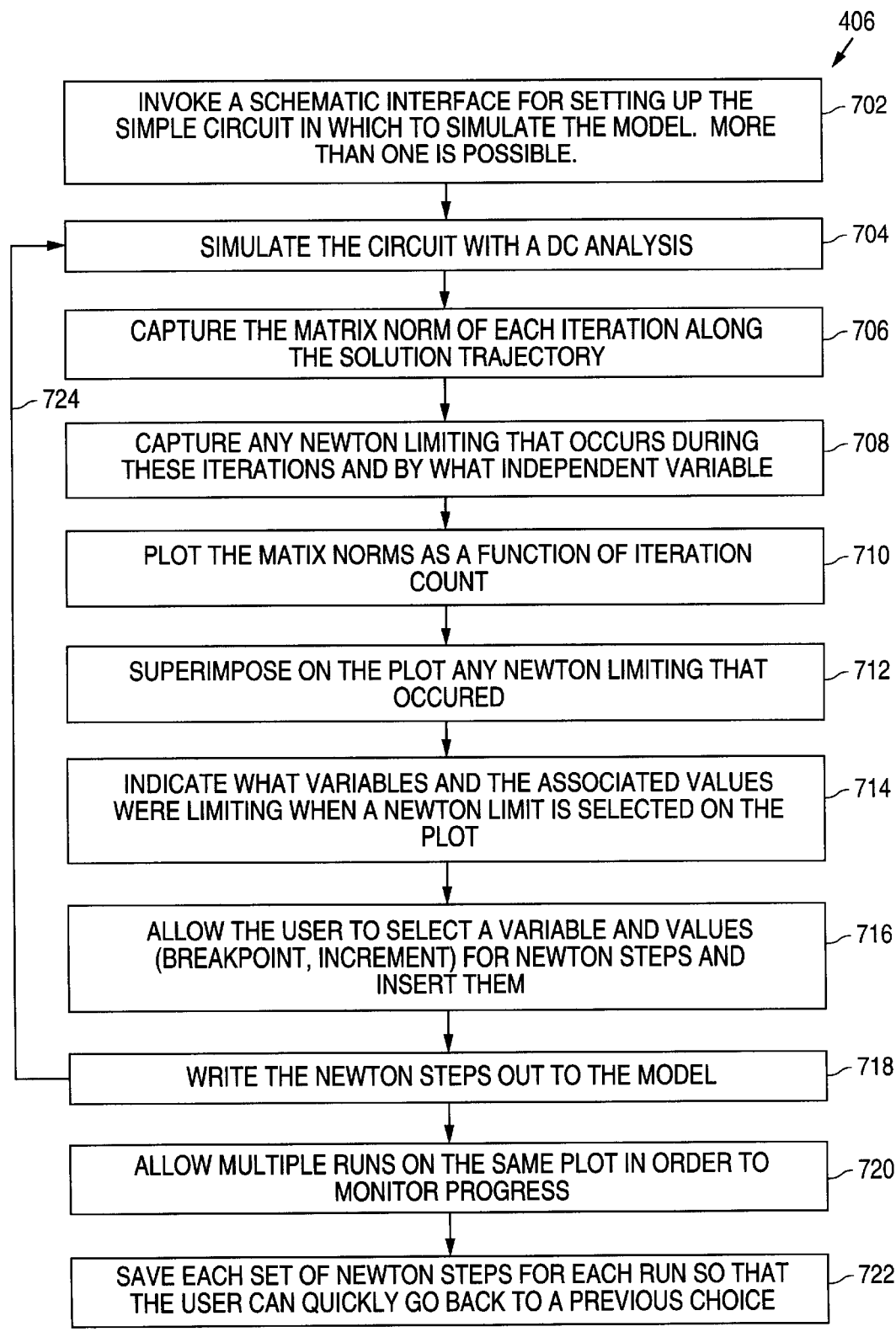
FIG. 7 Newton Step Manager procedure flowchart

This process is illustrated in the flow diagram of FIG. 7, showing the principle steps of the Newton step manager process. The Newton step manager process begins at step 702 with invoking a schematic interface for setting up a device-under-test (DUT) circuit in which to simulate the model of interest. The defined circuit is simulated, 704, using a DC analysis. The actual simulator must be used in conjunction with the Newton step tool. The Newton step tool will utilize the simulation assistant (118 in FIG. 1) to communicate with the simulator and to collect the simulation results, such as matrix norm data. The next step 706, is capturing the matrix norm of each iteration along the solution trajectory. The matrix norm can be the matrix 2-norm for example, or any one of several other matrix norms known in linear algebra.

In prior art, this detailed numerical information that is created during the simulation process was not made available to the user, as it is of little or no intuitive value to the typical user in its raw form in any event. The next step is capturing an indication of any Newton limiting that occurs during these iterations and an indication of what independent variable was limited, step 708. Step 710 calls for plotting the matrix norms as a function of iteration count. Step 712 calls for superimposing on that plot any Newton limiting that occurred.

FIG. 8 is an example of a screen display produced according to one possible implementation of the Newton step manager tool of FIG. 7. This shows a plot of matrix norms as a function of iteration count. Each iteration is indicated by a corresponding vertical line ascending from the horizontal axis 802, with the matrix norm value corresponding to the vertical axis 804. Each Newton limiting event is indicated by an x, such as the limiting events at 810 and 812. The plot also includes a display 814 identifying the limited variables and the corresponding Newton limiting events. For example, in this plot, variable Q.1/VBE (i.e., the base to emitter voltage of transistor Q1) is the variable that caused Newton limiting at iteration counts 4 and 20, while Q.1/VBC (i.e., the base to collector voltage of transistor Q1) caused Newton limiting events at iteration counts 14 and 15. This allows for interactive graphical assignment of Newton steps. The method calls for choosing the Newton steps so as to cause the model to converge to a solution (implied by the matrix norm going to zero in FIG. 8) the first time that the norm descends to a minimum, if possible. This graphical feedback, along with the indicated limiting information, allows the user to select Newton steps for the model under selected circuit conditions, that will converge in a near optimal fashion.

Referring back to the flowchart of FIG. 7, we have described the steps of plotting the matrix norms as a function of iteration count, 710, superimposing on the plot any Newton limiting that occurred, 712, and indicating what variables and the associated values were limited when a Newton limit is selected on the plot 714. In this regard, a pointing device may be used to select one of the Newton limiting events for display of the associated values at that time.

The Newton Step manager process of FIG. 7 further provides for selecting a variable and values (breakpoint, increment) for Newton steps and inserting them into the model. For example, "clicking" on a variable name in the display of FIG. 8 can be used to select the indicated variable to inspect, input or modify the associated breakpoint and increment values. A suitable menu or panel can be displayed to the user in response to the variable name selection for this purpose. The modified Newton steps are written out to the model, step 718, and the process is repeated beginning with the simulation step 704 in order to see the effects of the Newton step revisions. A graphical display of the type illustrated in FIG. 8 presents the results in a relatively simple, intuitive way. The loop 724 is repeated as may be necessary for interactively adjusting Newton steps until convergence satisfactory to the user is achieved (720). The process further calls for saving each set of Newton steps for each run so that the user can quickly go back to review a previous choice, step 722. This interactive, graphical tool, like the sample point manager, will significantly reduce the time it takes to produce useful analog and mixed signal simulation results. The simple screen display examples shown herein are merely illustrative. Various screen displays, including multimedia presentations, use of color, 3-D, animation, etc. can be used within the scope of the present invention to achieve the purposes described herein.

1. Automatic Newton Step Limiting

Figure 24:
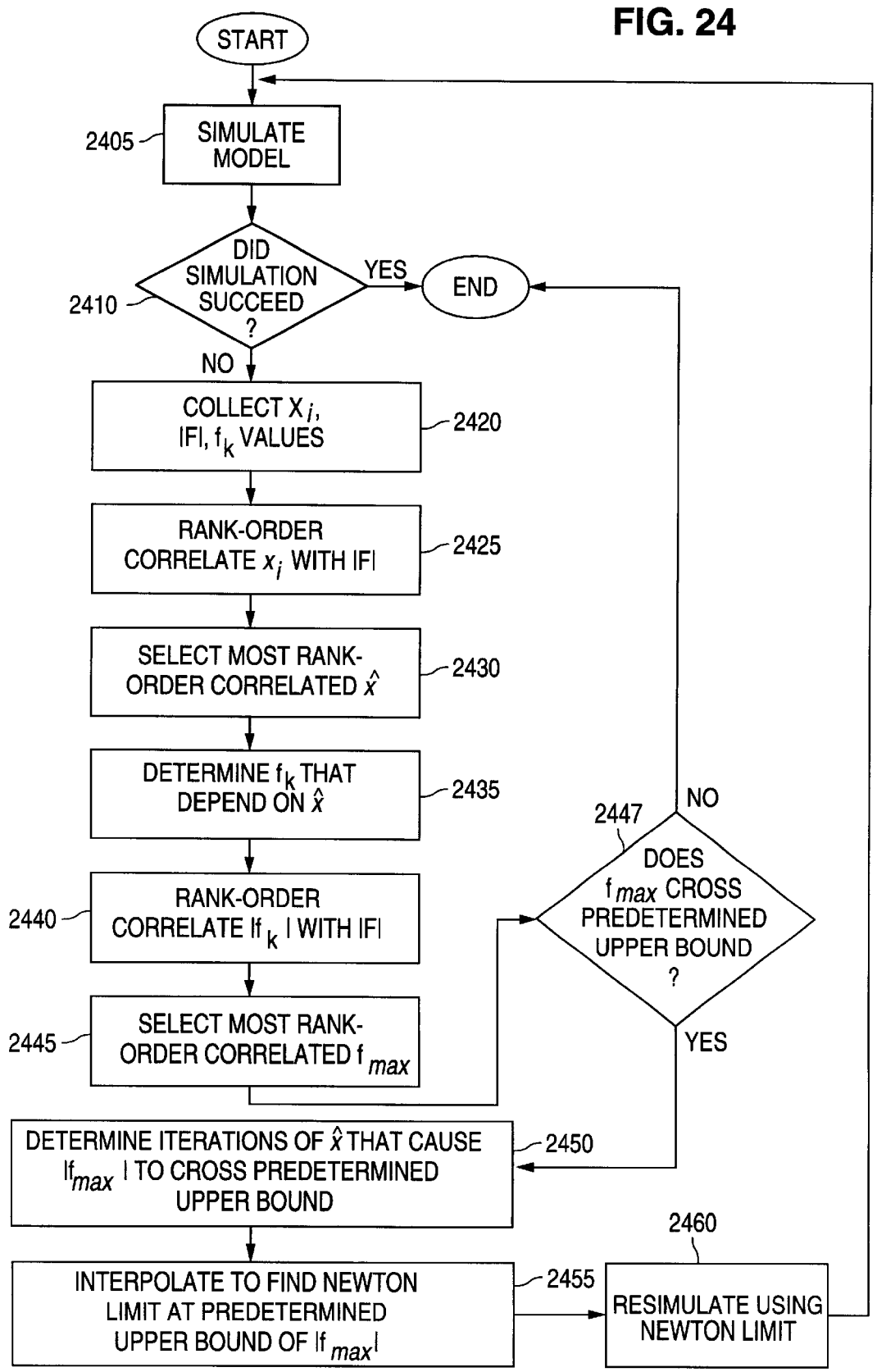

Described below, with reference to FIG. 24, is one implementation of an automated method of determining Newton steps. When a DC simulation of a circuit or system fails due to non-convergence (steps 2405, 2410), the simulation is rerun with a modified simulator setting to gather data relevant to the failure (step 2420). Specifically, the following data are collected:

The values for each independent variable $x_i$ at each iteration of the DC analysis, where $x_i$ is the $i^{th}$ independent variable. Thus, $x_i$ is a vector of values whose length is determined by the number of iterations in the failed simulation.

The matrix norm values $|F|$ at each iteration of the DC analysis, where the matrix F defines the functions whose roots are sought using the Newton-Raphson algorithm.

The values of the nonlinear functions $f_k$ at each iteration of the DC analysis, where $f_k$ is the $k^{th}$ nonlinear function.

This information is taken as input by an algorithm which performs a non-parametric rank-order correlation between the matrix norm values $|F|$ and the values of the independent variables $x_i$ (step 2425). In the preferred embodiment, Spearman's non-parametric rank-order correlation is performed. (For information about Spearman's non-parametric rank-order correlation, see W. H. PRESS ET AL., NUMERICAL RECIPES IN C, (2d ed. 1992).) A ranked list of independent variables xi is produced, which represents the independent variables most rank-order correlated to $|F|$. The most highly rank-order correlated independent variable $\hat{x}$ is selected (step 2430). The nonlinear functions $f_k$ which depend on $\hat{x}$ in a nonlinear way are determined (step 2435). This determination is done through a functional dependency analysis (see below with reference to FIG. 25). For purposes of describing how Newton limits are determined, it is assumed that this functional dependency analysis is performed outside the simulator.

Once the nonlinear functional dependencies are known, a second non-parametric rank-order correlation is performed, this time using the matrix norm values $|F|$ and the values of the nonlinear functions $|f_k|$ that depend on the independent variable $\hat{x}$ (step 2440). The most highly rank-order correlated nonlinear function $f_{max}$ is thus determined (step 2445). Then the maximum value of $|f_{max}|$ is determined.

For each nonlinear function, a predetermined upper bound is defined as part of the simulation. Call this predetermined upper bound $f_{max,\ upper}$. (Note, however, that the predetermined upper bound depends on the type of nonlinear function: the predetermined upper bound differs for charges, voltages, currents, etc. Note also that there may be more than one nonlinear function causing simulation divergence: setting a Newton limit for one independent variable $\hat{x}$ based on one nonlinear function $f_{max}$ may not be enough to force convergence.) If the maximum value of $|f_{max}|$ exceeds $f_{max,\ upper}$, then there is evidence that Newton limiting can address the source of non-convergence. If not, then there is no evidence that Newton limiting will be a remedy and the Newton step manager algorithm can be exited. (Note that the absolute value of $f_{max}$ is used, as $f_{max}$ could be anti-rank-order correlated: that is, $-f_{max}$ could become larger as $\hat{x}$ becomes larger.)

The Newton limit algorithm then determines the two iterations that "enclose" the predetermined upper bound $f_{max,\ upper}$. These two iterations are the ones corresponding to the maximum value of $|f_{max}|$ and the first iteration preceding it that has a value of $|f_{max}|$ less than $f_{max,\ upper}$, upper, thus "enclosing" the upper bound for interpolation purposes. Let these iterations be referred to as after and before, respectively. In many cases, before=after−1, but this is not necessary. Then $|f_{max}(\text{before})|$ and $|f_{max}(\text{after})|$ are the values of the function $|f_{max}|$ at the selected iterations, respectively. In other words, $|f_{max}(\text{before})|$ is the value of $|f_{max}|$ at the last iteration before the one that caused the maximum value of $|f_{max}|$ whose value is below the predetermined upper bound $f_{max,\ upper}$, and $|f_{max}(\text{after})|$ is the maximum value of $|f_{max}|$. Let $\hat{x}(\text{before})$ and $\hat{x}(\text{after})$ be the values of the most highly rank-order correlated independent variable at the corresponding iterations, respectively. By linear interpolation, the value of $\hat{x}$ can be computed, and this interpolated value is a Newton limit for the most highly rank-order correlated independent variable $\hat{x}$ (step 2455). In other words, the Newton limit $\hat{x}_{Newton}$ to apply to the independent variable $\hat{x}$ is:

$$\hat{x}_{Newton} = \frac{(f_{max, upper} - |f_{max}(\text{before})|)}{(|f_{max}(\text{after})| - |f_{max}(\text{before})|)} \times (\hat{x}(\text{after}) - \hat{x}(\text{before})) + \hat{x}(\text{before})$$

The simulation can then be rerun, applying the Newton limit (step 2460).

Figure 26:
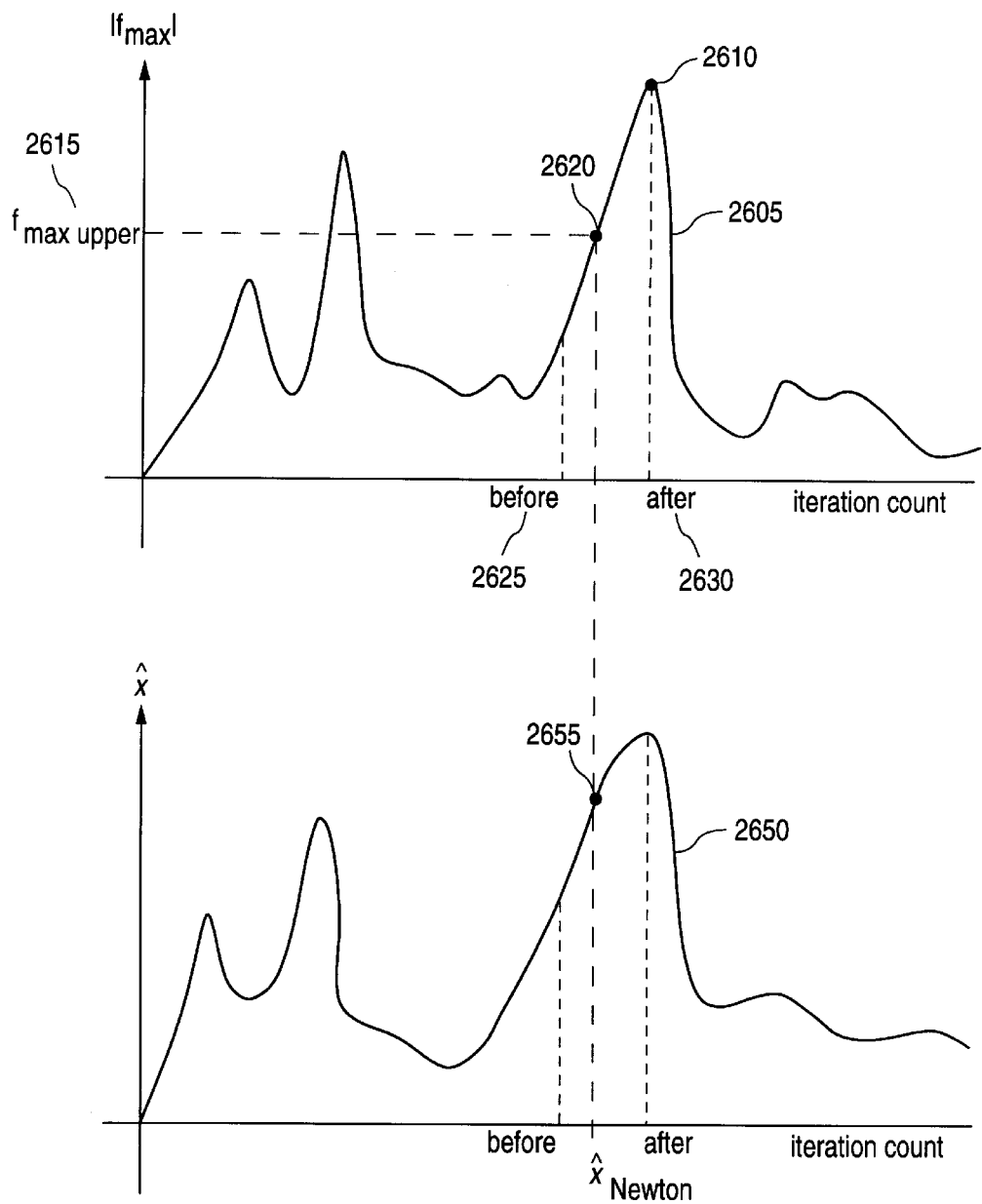

FIG. 26 shows graphically how a Newton limit is calculated. Once the most rank-order correlated nonlinear function $f_{max}$ 2605 is determined, the maximum value 2610 of $|f_{max}|$ is determined. In the example of FIG. 26, it is assumed that the maximum value 2610 occurs at the first iteration 2630 after the predetermined upper bound $f_{max,\ upper}$ 2615 is reached. Observe that the predetermined upper bound $f_{max,\ upper}$ 2615 is crossed more than once. The only crossing of interest is the crossing 2620 immediately preceding the maximum value 2610 of $|f_{max}|$.

Once the iterations surrounding the crossing 2620 are determined (in FIG. 26 these iterations are marked before 2625 and after 2630), the values of $\hat{x}$ 2650 at iterations before and after are used to interpolate $\hat{x}$ to the approximate value it takes (2655) where $|f_{max}|$ crosses the predetermined upper bound $f_{max,\ upper}$ 2615 at 2620. This approximate value 2655 is the Newton limit.

2. Functional Dependency Analysis

As mentioned above, determining which nonlinear functions $f_k$ depend on an independent variable $x_i$ requires a functional dependency analysis. A functional dependency analysis can be done by the simulator at the time of the simulation, or it can be done outside the simulator and the results stored for later use. For performance reasons, the preferred embodiment performs a functional dependency analysis outside the simulator.

Functional dependency analysis is the process of determining the constants, parameters, and variables on which a dependent variable depends. Constants are numbers that do not change over time or within the system. Parameters are values that are locally defined or are passed in as arguments.

Parameters differ from constants in that, while parameter values do not change during the course of a simulation, parameter values can change across simulations. Thus, if the functional dependency analysis is done outside of the simulator, the actual parameter values are not known when the functional dependency analysis occurs. Variables include both dependent and independent variables (it is possible for a dependent variable to itself depend on other dependent variables). Functional dependency analysis also determines the expressions needed to be calculated to evaluate a dependent variable. Finally, functional dependency analysis determines the type of dependency (this will be explained more fully shortly).

The results of the functional dependency analysis are required by other parts of Model Architect. For a given dependent variable, the Newton Step Tool needs to know the set of independent variables upon which this variable has a nonlinear dependence. The Sample Point Tool also needs to know this set for a given dependent variable. Functional dependency analysis also allows the Equation Plotting Tool (including the Check Continuity) and the Sample Point Tool to evaluate a dependent variable. The functional dependency analysis indicates which parameters and variables need to have values specified in order for the dependent variable to be successfully evaluated. It can also indicate which predefined constants need to be known by the routine that will evaluate the dependent variable. The evaluation of the dependent variable may consist of multiple assignment statements and multiple conditional statements.

Figure 25:
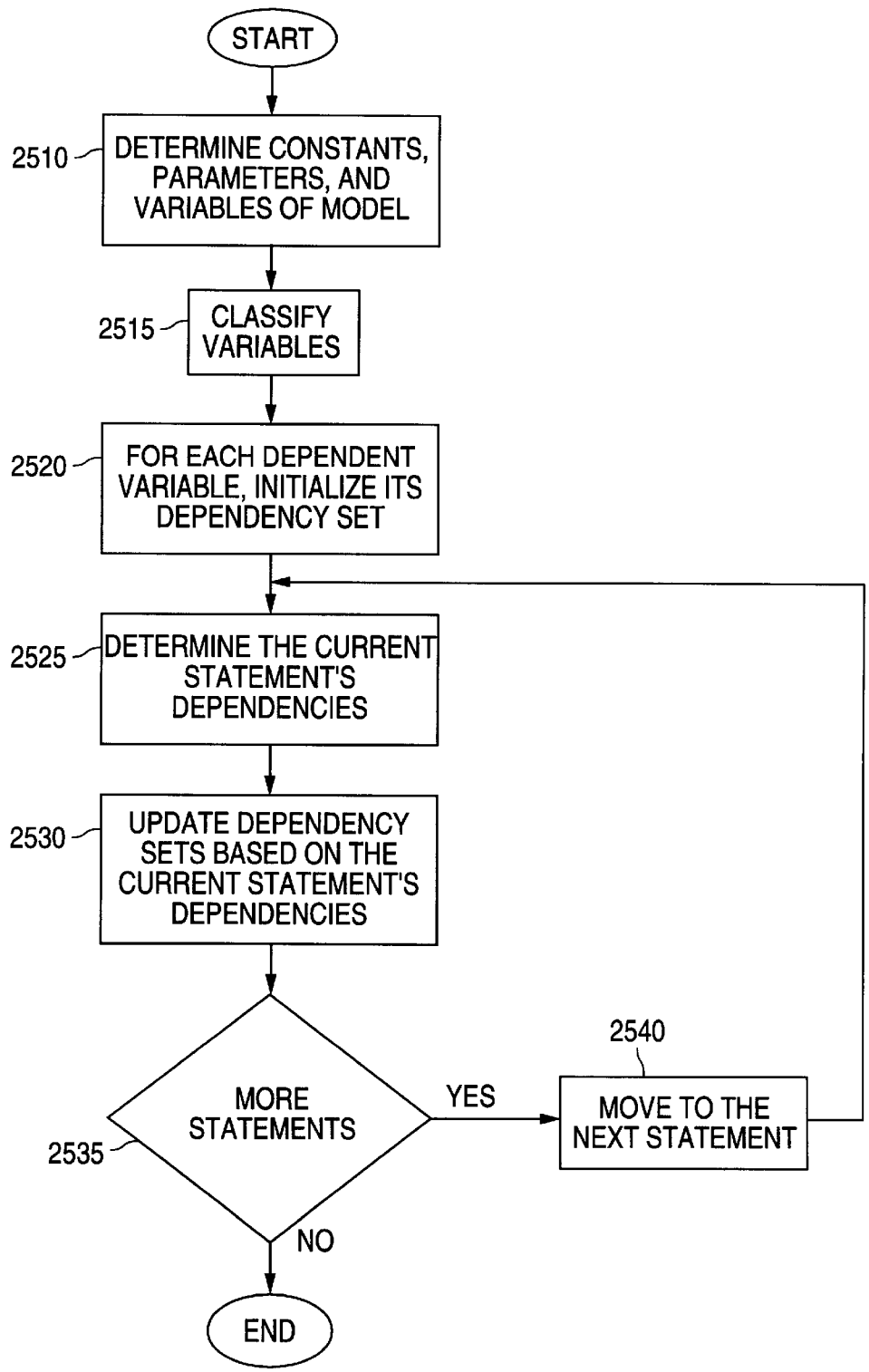

Referring to FIG. 25, functional dependency analysis begins by determining the constants, parameters, and variables in the model being simulated (step 2510). Then, the variables are classified as independent, dependent, or potential independent (step 2515).

Next, the analysis initializes dependency sets for each dependent variable (step 2520). These are sets of variables on which dependent variable depends. Although in general dependency sets can include dependent variables, for purposes of Newton step assignment and evaluation, dependency sets include only independent and potential independent variables. Note that including in a dependency set an independent variable on which the dependent variable does not depend will not affect the analysis, provided that there is an indication that the dependent variable does not depend on the included independent variable. Each dependent variable starts without any dependencies. The analysis then iterates through the assignment and condition statements. At each statement, the analysis determines the statement's dependencies (step 2525) and updates the dependency sets for each dependent variable as needed (step 2530). If more statements remain to be analyzed (step 2535), the analysis then examines the next statement (step 2540), repeating the above analysis.

As each assignment or condition statement is analyzed, there are three levels of dependency analysis that can be performed (step 2525). A standard dependency analysis will determine the independent variables on which a dependent variable depends, and the constants and parameters upon which the dependent variable directly depends. A full dependency analysis will go one step further than a standard dependency analysis, and will determine the independent constants and parameters upon which the dependent variable depends, whether directly or indirectly. Note that the only difference between a standard and a full dependency analysis lies in the treatment of parameters. An expressional dependency analysis determines which expressions need to be evaluated to calculate the dependent variable.

To understand the difference between a standard and a full dependency analysis, consider the following example. Assume that math_pi is a predefined (system defined) constant, p and q are local parameters (constants), x is an independent variable, and y is a dependent variable, and that the following equations are defined:

$p=math\_pi$ $q=2*p$ $y=\sin(q*x)$

Note that $q=2*p=2*math\_pi$. A standard dependency analysis would determine that y depends on x and q. A full dependency analysis would determine that y depends on x and math_pi. Note that literals, such as the number "2," are not included in the dependency set.

There are 8 types of dependency. In increasing order of dependency, they are listed in Table 1.

TABLE 1

| Dependency | Definition |
|---|---|
| None | no dependency |
| Linear | the expression involves a scalar (constant, parameter, or literal) multiple of the independent variable |
| Affine | the expression involves a scalar (constant, parameter, or literal) multiple of the independent variable, plus a variable, parameter, or non-zero constant |
| Nonlinear | the expression involves an independent variable according to some mathematical formula but is not linearly or affine dependent |
| Undefined | the expression involves a non-analog variable (e.g., a Boolean variable or a character string) |
| Varying | the expression is part of an "if-then-endif" or "if-then-else-endif" statement |
| Constant | the expression involves only constants, parameters, or literals |
| Error | the expression involves an error (e.g., an assignment of an analog variable to a constant or parameter) |

Where an expression involves multiple variables, parameters, or constants, the dependency to each variable, parameter, and constant should be determined. Where a dependency can be defined in more than one way, the highest dependency is to be used.

To help make this clear, consider some examples. Let a, b, and x be time varying analog variables, p be a constant or parameter, and c and d be Boolean variables. Then: a+b is affine dependent on a and b; a+p is constant dependent on p and affine dependent on a (as long as p is not a zero constant, in which case the expression is linear dependent on a); a*p and a/p are linear dependent on a and constant dependent on p; a*b and a/b are nonlinear dependent on a and b; an unknown function f(a, p) is nonlinear dependent on a and constant dependent on p; c&d is undefined dependent on c and d (or varying dependent on c and d if the expression is in a condition statement); and a<p is constant dependent on p and undefined dependent on a (or varying dependent on a if the expression is in a condition statement).

To determine the dependency for an arithmetic expression, the dependencies of the sub-expressions are all combined together. When a variable appears in more than one sub-expression, the variable gets the highest type of dependency. So, for example, the expression (a+x)+(a*b/p) is affine dependent on (a+x) and (a*b/p). The sub-expression (a+x) is affine dependent on a and x. The sub-expression (a*b/p) is nonlinear dependent on a and b and is constant dependent on p. Therefore, the full expression is nonlinear dependent on a and b, affine dependent on x, and constant dependent on p. Note that the expression is nonlinear dependent on a and not affine dependent on a because nonlinear dependency is higher than affine dependency. Similarly, the expression (a+b)*(a+p) can be seen to be nonlinear dependent on a and b and constant dependent on p.

Because each dependent variable is associated with a set of independent variables and a type of dependence upon each independent variable in this set, a dependency on a dependent variable in a later equation can be replaced by a dependency on a set of independent variables. When a dependent variable is calculated, the dependencies of all variables are put in terms of the independent variables (and constants) and the dependency is combined. As when dealing with a single expression the higher types of dependencies take precedence over the lower types of dependencies. Finally, each time a dependent variable appears on the left hand side of an assignment statement, its current dependencies are reset with the dependencies found from the right hand side of the assignment.

Thus, for example, if u, w, and x are independent analog variables, y and z are dependent analog variables, and p is a constant, the three equations below generate the following dependency sets:

$y = p*u$  y depends linearly on $u$ and constant on $p$.

$z = w/x$  z depends nonlinearly on $w$ and $x$.

$y = z+y$  y depends nonlinearly on $w$ and $x$, affine on $u$, constant on $p$.

Expressions in condition statements (i.e., if-then-endif statements) are handled in a similar manner, except that the expressions are also varying dependent on the condition. So, for example, if u, v, w, and x are independent analog variables, y and z are dependent analog variables, and p and q are constants, then the conditional statement below generates the following dependency sets:

if $(v < p*w)$ then  Depends varyingly on $v$ and $w$, constant on $p$.

$y = w^\wedge q$  y depends varyingly on $v$ and $w$, constant on $p$ and $q$.

$z = x$  y depends varyingly on $v$ and $w$, linearly on $x$, constant on $p$.

endif

If the condition statement has two branches (i.e., if-then-else-endif statements), then the dependencies within each branch are determined and then combined. What differs from one branch condition statements is that the dependencies of the two branches are combined. So, for example, the condition statement below generates the following dependency sets:

if $(v < p*w)$ then  Depends varyingly on $v$ and $w$, constant on $p$.

$y = w^\wedge q$  y depends varyingly on $v$ and $w$, constant on $p$ and $q$.

$z = x$  z depends varyingly on $v$ and $w$, linearly on $x$, constant on $p$.

else $y = u*w$  y depends varyingly on $v$ and $w$, nonlinearly on $u$, constant on $p$.

$z = w$  z depends varyingly on $v$ and $w$, constant on $p$.

endif  y depends varyingly on $v$ and $w$, nonlinearly on $u$, and constant on $p$ and $q$; z depends varyingly on $v$ and $w$, linearly on $x$, and constant on $p$.

Potential Independent Variables

Potential independent variables are variables that the simulator can treat as independent variables. As long as the simulator is designed to take advantage of potential independent variables, defining potential independent variables can lead to more efficient computations within the simulator. This occurs because potential independent variables can help reduce the number of independent variables in the system, simplifying the equations the simulator must solve.

In general a potential independent variable (PIV for short) is a dependent analog variable which satisfies the following conditions:

Condition 1: The variable is equal to (assigned from) an independent variable (i.e., the dependent variable is used as an alias), the negative of an independent variable, or the difference of two independent variables.

Condition 2: The variable is either affine dependent on exactly two independent variables or linearly dependent on exactly one independent variable, and has no dependence on all other independent variables.

Although they do overlap to a degree, conditions 1 and 2 do not completely coincide. In the equation y=w+x, condition 2 would be satisfied, but not condition 1, so y could not be a PIV. And in the following type of situation:

if $(u < v)$ then $y = x$ else $y = -x$ endif y satisfies condition 1 but not condition 2 (because it has a varying dependence on independent variables u and v), and so cannot be a PIV.

Condition 3: The variable depends on constants or parameters only in a varying manner (i.e., the dependence on a constant or parameter occurs because the constant or parameter is in a condition).

Condition 4: The variable is used as "input" to an expression (i.e., the variable is used in a condition or on the right-hand side of an assignment in the same manner that an independent variable would be used) that defines a variable other than itself. This condition prevents y in the following example from being a PIV:

beginning of model $y = u$ $y = y - v$  y redefined as $u - v$.

...  More equations where y is used, if at all, only to redefine itself (in other words, if y occurs on the right-hand side of an assignment statement, it also occurs on the left-hand side of the assignment statement).

end of model

Since y is never used in an assignment statement except to redefine itself, per condition 4 y cannot be a PIV.

Condition 5: Only one definition of the variable is used in the model for purposes other than to redefine the variable itself.

Our implementation makes the following further simplifying assumption: If a variable was at any point defined in a manner inconsistent with being a potential independent variable, then the variable is considered not to be a potential independent variable. The implementation does not check whether or not the variable was actually used in an expression prior to being redefined in a manner consistent with being a potential independent variable. In essence this implementation assumes that no expression is superfluous (a superfluous expression is one whose removal from the model would result in an equivalent model). This simplifying assumption could result in erroneous classifications only when there are superfluous expressions in the model, as a variable that could otherwise be a PIV would not be so classified. This might slow down the simulation, but would not affect the results.

The model's equations are examined and potential independent variables are identified. During the analysis, once a variable is no longer classified as a potential independent variable, it cannot regain the classification of being a potential independent variable.

The formation of the set of potential independent variables is not finished until all the expressions in the model have been analyzed. Prior to this point, all classifications are preliminary guesses.

A common example of a potential independent variable would be a branch voltage, v(p,q)=v(p)−v(q).

In the examples below, let u, v, w, and x be independent analog variables, a, y, and z be dependent analog variables, and p and q be constants or parameters.

$y = -u$    y could be a *PIV*.

$y = y + v$    y could still be a *PIV*.

$y = x + y$    y will not be a *PIV* if it is used in a condition or on the right-hand side of an assignment statement, because y is affine dependent on three independent variables x, v, and u ($y = x + v - u$) (violating conditions 1 and 2). But if y is redefined according to the conditions before this assignment of y is used, then y could still be a *PIV*.

Note that, under the chosen implementation, it does not matter whether this assignment to y is ever used: y cannot be a PIV.

$y = w$    y could be a *PIV*.

$z = y$    z could be a *PIV*.

$y = u + 1$    y will not be a *PIV* if it is used in a condition or on the right-hand side of an assignment statement, for two reasons: first, y is affine dependent on exactly one independent variable, u (violating conditions 1 and 2); and second, y has previously been used with a different definition (violating condition 5). But if neither this nor any other assignment of y is used, then y could be a *PIV*.

First, observe that z could still be a PIV, as z is defined (through y) as w. Second, note that, as in the previous example, under the chosen implementation, it does not matter whether the second assignment to y is ever used: y cannot be a PIV.

$y = w$    y could be a *PIV*.

$y = y * v$    y will not be a *PIV* if it is used in a condition or on the right-hand side of an assignment statement, because y depends nonlinearly on w and v.

$y = w - x$    y could be a *PIV*.

Compare this example with the previous one: in this example, condition 5 does not apply, as the second definition of y was never used in a condition or on the right-hand side of an assignment statement. However, the chosen implementation would say that y is not a PIV, because of the second expression. (Note also that the implementation's classification would be correct if the second expression were not superfluous to the model: if y had been used after the second expression and before the third expression, then y could not be a PIV.)

if ($p < q$)

$y = w - x$    y could be a *PIV*.

else $y = x$    y could be a *PIV*.

endif

Observe that, since p and q are either constants or parameters, only one of the assignment statements for y will ever apply per simulation. Since it doesn't matter which branch of the condition is taken, we can determine that y could be a PIV even without knowing whether or not p<q.

if ($p < q$)

$y = w - x$    y could be a *PIV*.

else $y = 0$    y will not be a *PIV*.

-continued

```
    endif
```

As with the previous example, since p and q are either constants or parameters, only one of the assignment statements for y will ever apply per simulation. However, in contrast to the previous example, since it matters which branch of the condition is taken, we can not determine whether or not y could be a PIV without knowing the values for p and q. The best we can say is that y would be a PIV when p<q, and y would not be a PIV in when p≧q. (In the chosen implementation, we would not classify y as a PIV because we are performing the analysis prior to knowing the values of p and q, and y will not be a PIV for all possible values of p and q.)

$y = -v$    y could be a *PIV*.

if $(y > p)$ then $z = x$    z will not be a *PIV*, as z depends on y in a varying manner.

else $z = -x$    z will not be a *PIV*, as z depends on y in a varying manner.

endif $a = f(z)$    z is not a *PIV*

Note that in this example, since z is defined within a condition statement with a condition whose truth value can change during the simulation, z could not be a PIV. z will be dependent on the independent variable y (in the condition y>p) in a varying manner. (It does not matter whether or not y is actually greater than p during the simulation.)

C. Stamp Evaluator

Figure 23:
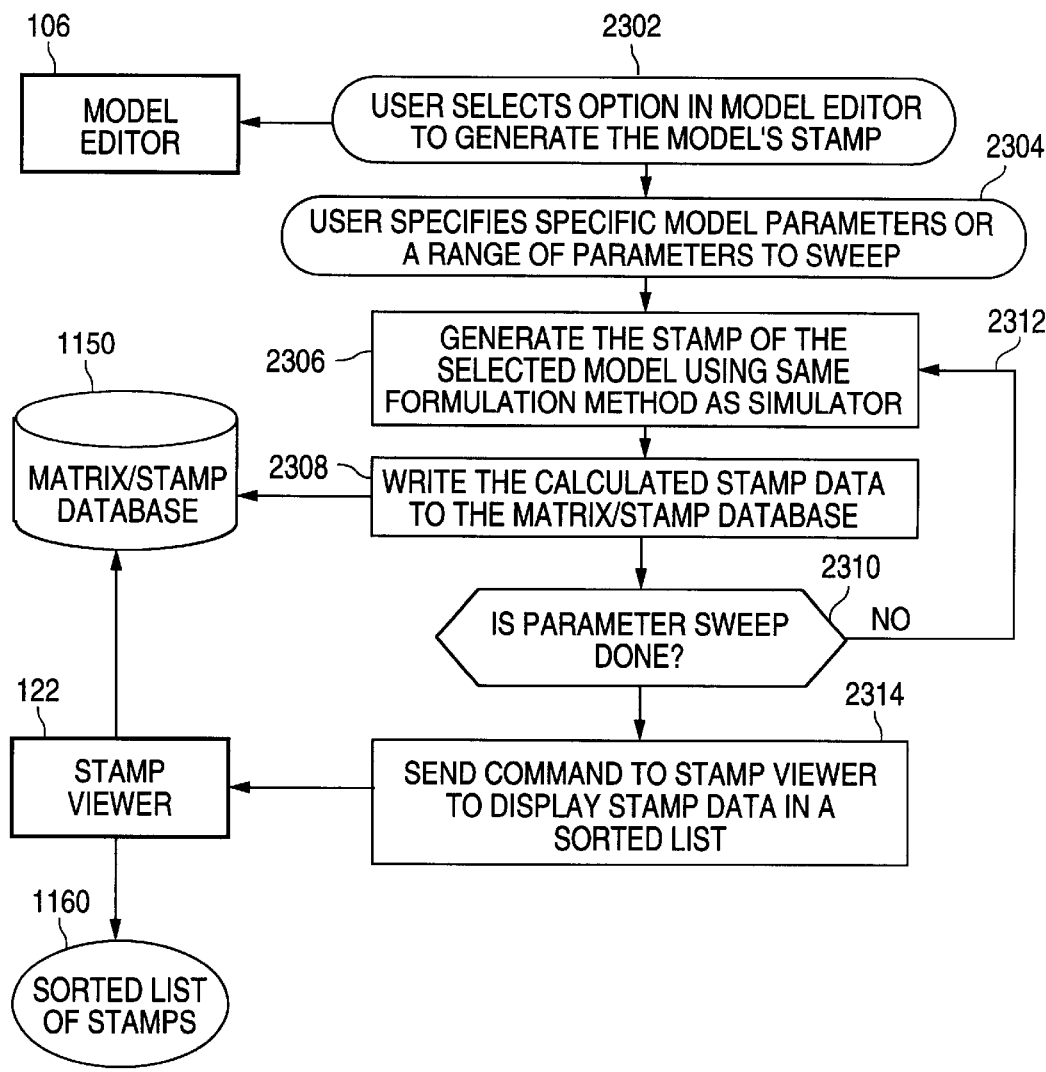

Another one of the model robustness tools 208 is a process for analyzing matrix element stamps, namely the stamp evaluator 408 in FIG. 4. FIG. 23 illustrates the stamp evaluator process for generating a set of stamps based upon sweeping parameter values. This feature is useful for predicting the effect of parameter variations on the system matrix of a simulation. In the model editor process 106 a user selects an option to generate the model's stamp, step 2302 in FIG. 23. The user also is invited to specify specific model parameters or a range of parameters to sweep. "Sweeping" is a series of steps in which the specified parameter value is varied by a predetermined increment until the specified range is completed. Step 2306 calls for generating the stamp of the selected model, assuming the initial value of the range, using the same formulation methods as the simulator with which the model is expected to be used. Next the process writes the calculated stamp data to the matrix/stamp database, step 2308. Decision 2310 determines if the parameter sweep has been completed, and if not control loops via path 2312 to increment the selected parameter value and generate a new stamp in step 2306. After the specified parameter sweep is finished, step 2314 calls for sending a command to the stamp viewer tool to display the resulting stamp data in a sorted list. The stamp viewer tool 122 generates the sorted list of stamps 1160. Upon inspecting the sorted list of stamps, the user is free to select any of the stamps for closer inspection. Refer to the description of FIG. 21, step 2110 and associated description above.

IV. Simulation Robustness Tools

Figure 11:
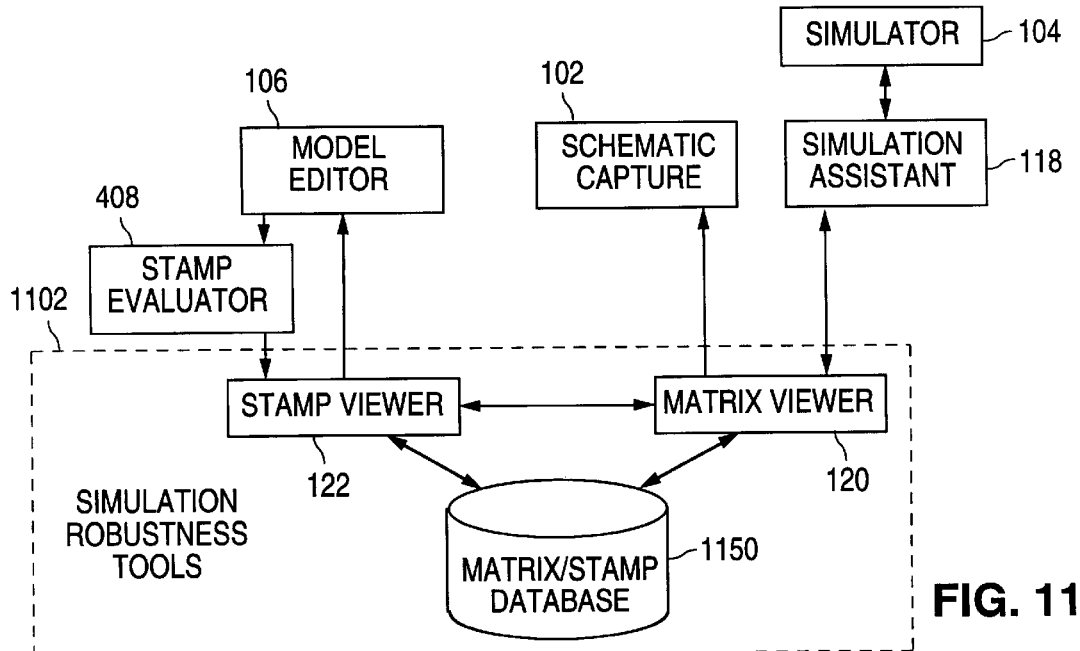
FIG. 11 Block diagram of Simulation Robustness Tools

FIG. 11 is a block diagram showing simulation robustness tools 1102 and their connections to other system elements, namely the model editor 106, schematic capture tool 102, simulation assistant 118 and the simulator 104. The simulation robustness tools comprise the stamp viewer 122, matrix viewer 120 and a matrix/stamp database 1150. The simulation robustness tools evaluate the numerical quality of the simulation. They provide a graphical, easy-to-use mechanism for a user to find and examine pertinent aspects of the matrix.

A. Matrix Viewer

One of the challenging problems in the prior art is the difficulty for most users of correlating the numerical properties of the system matrix to the models that contribute to the system matrix. Indeed, it is very difficult in existing systems to track or discover these relationships. The Matrix Viewer process of the present invention addresses this problem. It is essentially a matrix display and manipulation tool. It provides a novel way to link the numerical properties of the system matrix to the models at hand, and provide an interactive environment to aid the user in evaluating new algorithms or debugging simulation problems with greater facility.

Figure 12A:
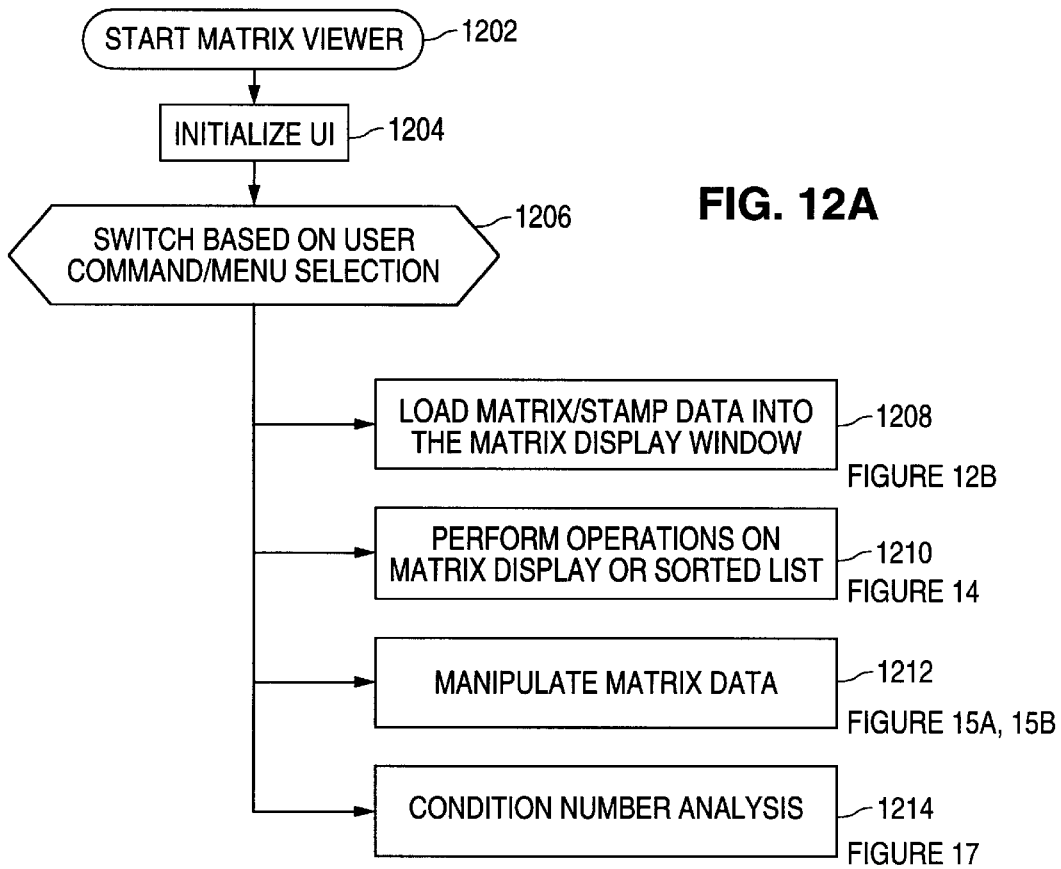
FIG. 12A Matrix Viewer process high level flowchart

The matrix viewer process 120 is described in general with reference to the flow diagram of FIG. 12A as follows. The process begins at 1202 and proceeds to initialize a graphical user interface step 1204, which includes opening a screen display window, loading menus, etc. At step 1206 the system waits for user input of a command or menu selection and, when the user selects "open menu" or the like, a file manager is invoked for selecting a matrix/stamp data file. Step 1208 calls for loading data from the selected matrix/stamp data file into the matrix display window, as further described below with reference to FIG. 12B and to FIG. 13.

Step 1210 calls for performing operations on the matrix display or on a sorted list of stamps as further explained below with reference to FIG. 14. Step 1212 calls for manipulating the matrix data as further described below with reference to FIGS. 15 and 16. Finally, the matrix viewer process can further include condition number analysis, step 1214, further described below with reference to FIG. 17.

Figure 12B:
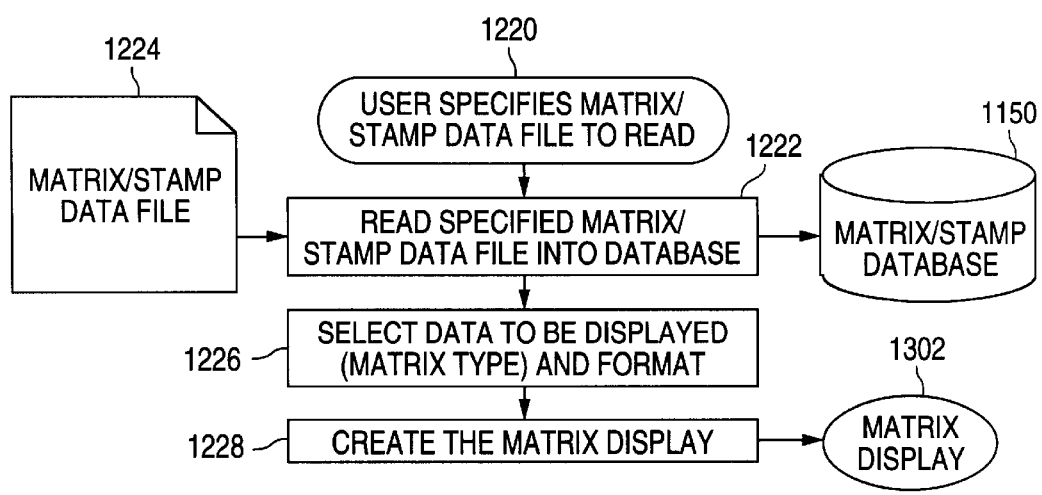
FIG. 12B loading matrix display aspect of the Matrix Viewer process
Figure 13:
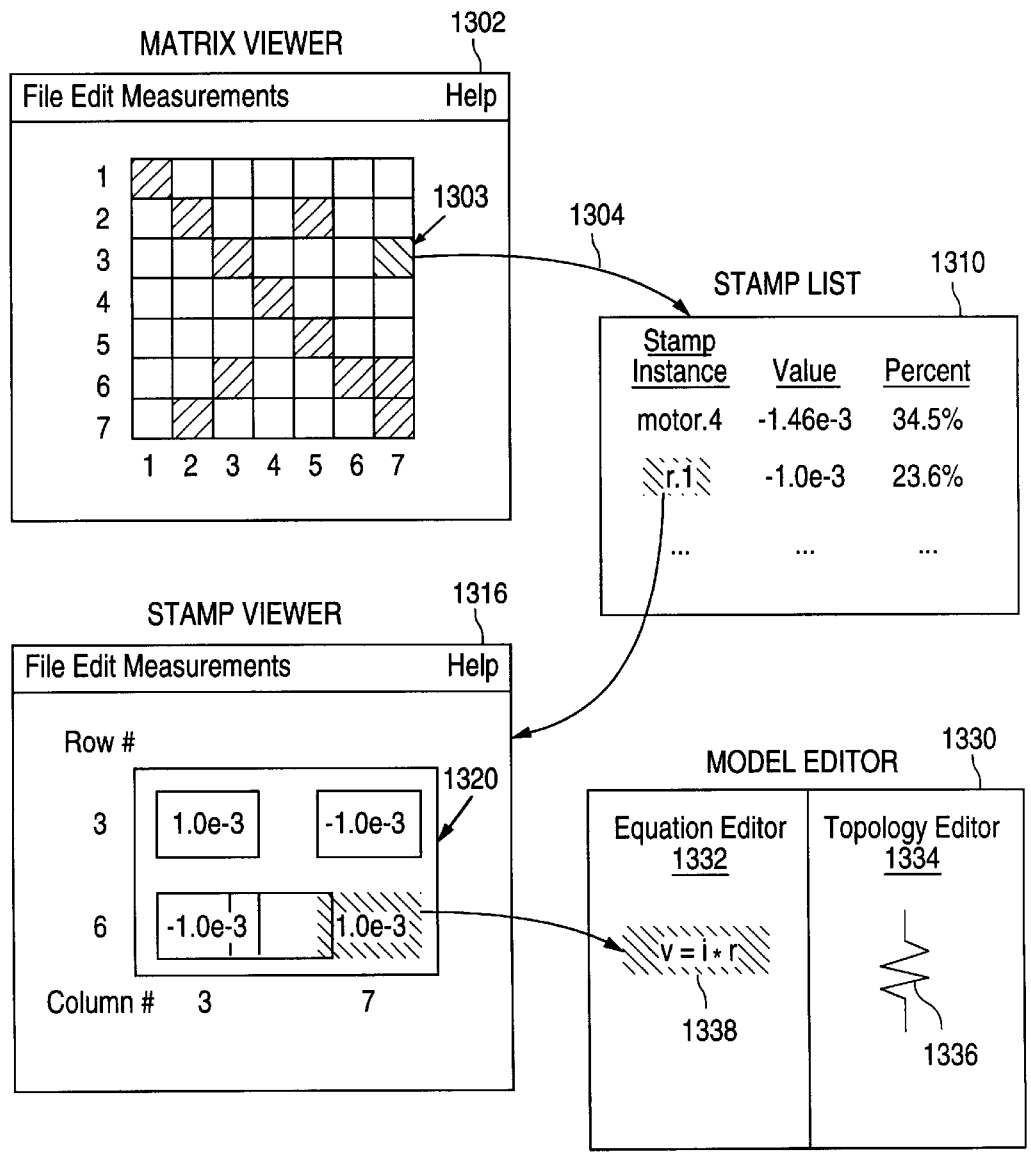
FIG. 13 Sample screen display illustrating interactive operation of simulation robustness tools FIG. 14 Matrix Viewer process operations flowchart FIG. 15 Matrix manipulation aspect of the Matrix Viewer process FIG. 16 Back annotation aspect of the Matrix Viewer process FIG. 17 Condition Number Analysis procedure flowchart FIG. 18 Equation and topology editor functional flowchart FIG. 19 Model Database functional block diagram FIG. 20 Stamp Viewer process flowchart FIG. 21 Stamp Viewer process graphical user interface flowchart FIG. 22 Flowchart of stamp display aspect of the Stamp Viewer process FIG. 23 Parameter sweep process for analyzing a matrix element stamp FIG. 24 Newton Limits Flowchart FIG. 25 Functional Dependency Analysis Flowchart FIG. 26 Newton Limit Calculation Example

FIG. 12B illustrates the process of loading the matrix display. In step 1220, the user specifies a matrix/stamp data file to be read. If the selected matrix/stamp data file 1224 does not already exist, it can be created by running a simulation using the simulation assistant tool. Using the simulation assistant tool (118 in FIG. 1), the user selects the model and the type of matrix information requested for display. The simulation assistant generates a command file and executes that command file in the simulator on the specified model. During simulation, the simulation assistant captures the requested matrix data and creates the matrix/stamp data file 1224. Referring again to FIG. 12B, the specified matrix/stamp data file is then read into a matrix/stamp database 1150. Next the user selects the data to be displayed, including matrix type and format. Various display format options such as color can be specified, 1226. Finally, step 1228 calls for creating the matrix display as specified, and then displaying the matrix as shown in FIG. 13, matrix viewer display window 1302. Referring to FIG. 13, the matrix viewer display window 1302 includes a generally rectangular grid in which each cell (row/column location) corresponds to a cell of the simulation matrix. The Matrix Viewer is capable of modifying the matrix display by providing features such as zoom, pan and region centering.

Trouble spots, as defined by a numerical threshold, can be centered in the display grid by the viewer automatically zooming and centering on a detected trouble spot. The user can step through these trouble spots and the display automatically selects the appropriate row/column region at a predetermined zoom factor. In addition, the Matrix Viewer can have several windows open either displaying the same or different matrix data from different zoom factors and regions. For example, the full matrix could be shown in one window while a zoomed-in display is shown in another window where a rectangular outline on the full matrix indicates the region that the zoomed-in window is displaying.

B. Matrix Viewer Operations

Figure 14:
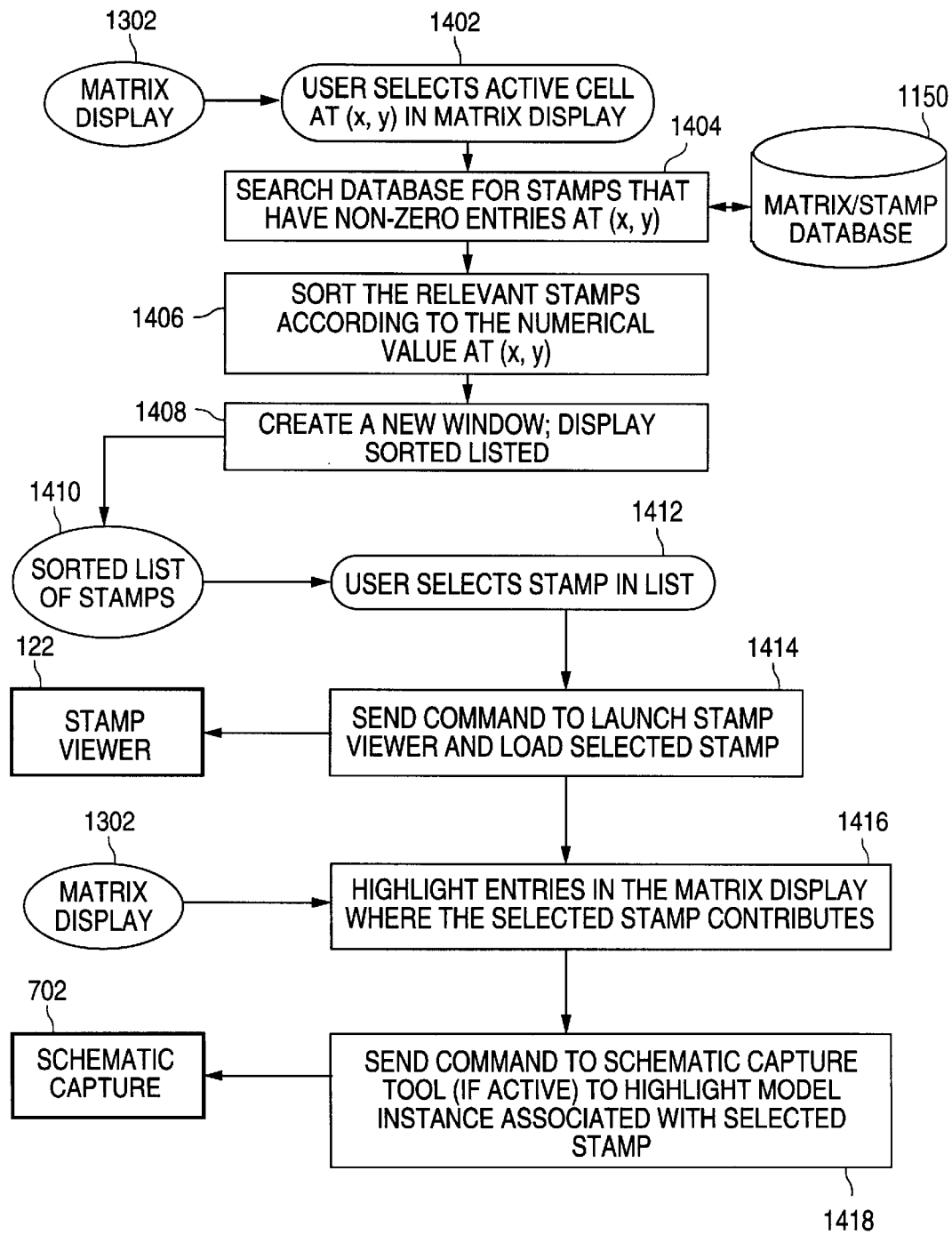

FIG. 14 illustrates various matrix viewer operations that can be carried out interactively using the user interface of FIG. 13, as follows. The matrix viewer window 1302 identifies the active (non-zero) matrix cells, for example by color, contour plot, numeric values, highlighting, etc. In step 1402 the user selects one of the active cells in the matrix display, for example by clicking a mouse or pointing device. Each cell is hyperlinked for finding stamps that have non-zero entries at the selected matrix location, i.e., model instances that contribute to the selected matrix cell. Thus, step 1404 calls for searching the matrix/stamp database 1150 to find stamps that have non-zero entries at the selected matrix cell. The matrix viewer process then sorts the relevant stamps according to their respective numerical values at the selected cell, step 1406, and then creates a new display window for displaying the sorted list, step 1408. This sorting step is preferred but not essential. In FIG. 13, a new window 1310 displays the sorted stamp list, for example in a three-column format, identifying each stamp instance in a first column, the numeric value of the stamp's contribution to the selected matrix cell in a second column, and the relative contribution of that stamp expressed as a percentage in a third column.

Next, the user selects a particular stamp of interest in the stamp list display window 1310, for example by pointing and clicking the mouse. This is step 1412 in FIG. 14. In response, the matrix viewer sends a command to launch a stamp viewer process and loads the selected stamp into the viewer process, step 1414. The stamp viewer process (122 in FIGS. 1 and 11) creates another new window, the stamp viewer window 1316 in FIG. 13. Referring again to FIG. 13, in the matrix viewer window 1302, the user selected the cell (3,7). Arrow 1304 indicates that this selection spawned the corresponding stamp list in stamp list display window 1310. In this example, the stamp list has two elements (model instances), namely a motor model instance motor.4 and a resistor model instance r.1 (using the syntax model_name.instance.) In that list, the user selected resistor instance r.1 for display, as indicated by arrow 1318. That selection, in turn, results in display of the corresponding stamp 1320 in the stamp viewer display window 1316.

In response to the selection of a particular stamp, the process highlights all entries in the matrix display to which the selected stamp contributes, step 1416. In the illustration of FIG. 13, the selected stamp (r.1) contributes to numerous matrix locations indicated by gray cells in the matrix viewer display window 1302. Examples are cells (2,2), (2,5) and (3,3). Finally, step 1418 calls for sending a command to the schematic capture tool (102) to highlight the model instance associated with the selected stamp. Accordingly, the schematic capture tool opens yet another display window, model editor display window 1330. The model editor includes the equation editor display 1332 and topology editor display 1334, in this case displaying the symbol for a resistor 1336 and the corresponding equation 1338 associated with the resistor instance r.1 selected by the user in the sorted stamp list display 1310. The described process gives the user a simple and convenient means for graphically seeing what model instances contribute to the matrix in what ways. It quickly shows which instances are most important, and how and where they influence the matrix. All of this is provided without requiring substantial simulation experience on the part of the user, and without requiring any knowledge of the hardware description language used in the modeling application at hand.

C. Matrix Manipulation procedures

Another important aspect of the matrix viewer tool is the ability to manipulate or modify the matrix. This process thus facilitates testing the effect that a particular stamp has on the overall matrix composition and characteristics. The matrix manipulation process is illustrated in the flow diagram of FIG. 15. Beginning at step 1502, it is assumed that a sorted list of stamps is displayed as described above. The user selects one or more stamps in the sorted list. The system retrieves the selected stamp in step 1504 from the matrix/stamp database 1150. The system then subtracts non-zero stamp entries from the corresponding matrix cells, step 1506. This has the effect of removing the stamp from the matrix, much like removing the corresponding circuit element from the model schematic. Step 1508 sets a flag if a matrix cell has changed from non-zero to zero, as this changes the matrix structure. Step 1510 tests whether all of the selected stamps have been processed and if not, control returns via loop 1512 to repeat the foregoing steps until all the selected stamps have been processed. Then the sorted list is updated, step 1514.

Decision 1518 determines whether a flag was set, and if not, the matrix display is updated, step 1520. If the matrix structure is not affected (i.e., the "gone to zero" flag is NOT set), then elaboration (reconstructing the matrix) is unnecessary and the affected matrix cell(s) value is updated by simple addition or subtraction. Thus the effects of the matrix manipulation are determined and displayed to the user without re-running the simulation. If the flag was set, step 1522 calls for regenerating the matrix display using the modified matrix/stamps.

D. Back Annotation

Figure 15:
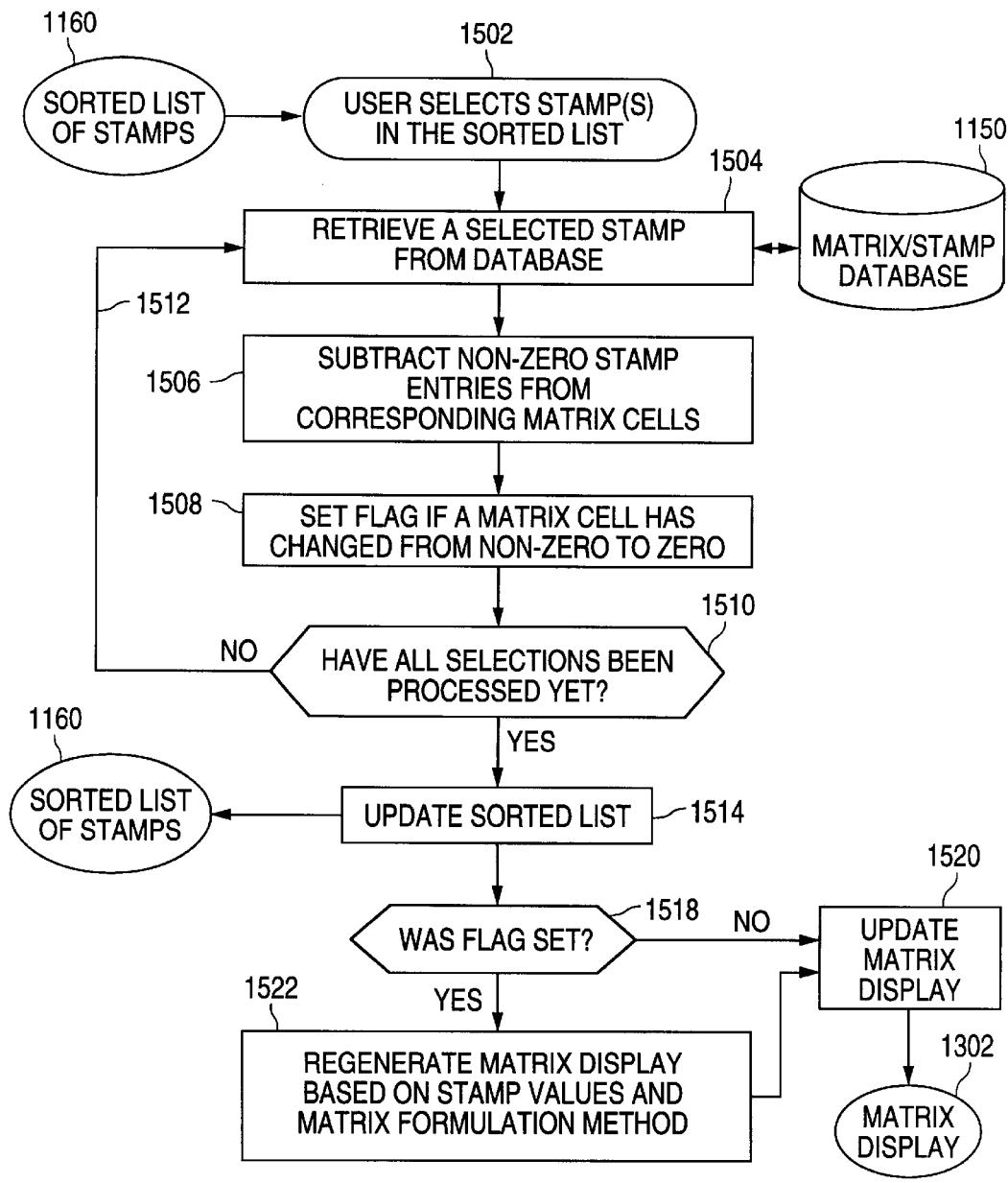
Figure 16:
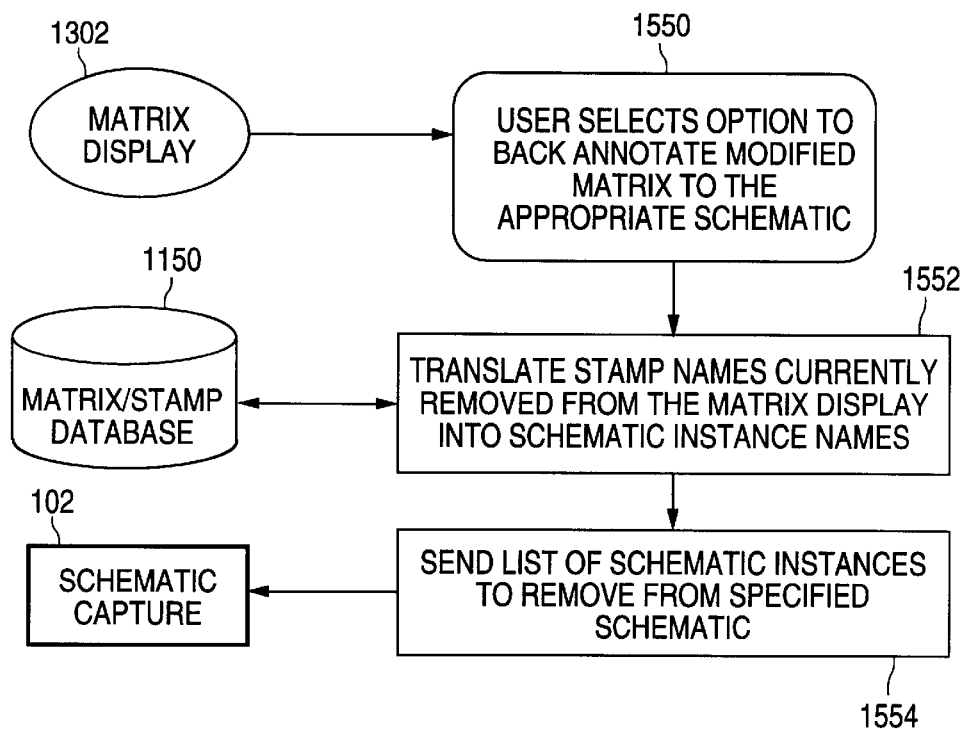

FIG. 16 illustrates a process of "back annotation" to a schematic diagram where the user has modified the matrix, as illustrated in FIG. 15, the user is presented an option to "back annotate" the modified matrix information to the corresponding schematic diagram. Referring to FIG. 16, the user selects this back annotation option in step 1550, through the matrix display. In other words, the option may appear in a pull down menu or a panel that is generated in response to the user modifying the matrix. If the option is selected, step 1552 calls for translating the stamp names which were removed from the matrix display into corresponding schematic instance names. This is done through communication with the matrix/stamp database 1150. The back annotation process then sends a list of schematic instances to be removed from the specified schematic to the schematic capture tool 102. This step is illustrated as 1554 in FIG. 16. The result of the back annotation process is to automatically make corresponding changes to the design schematic.

E. Condition Number Analysis

Figure 17:
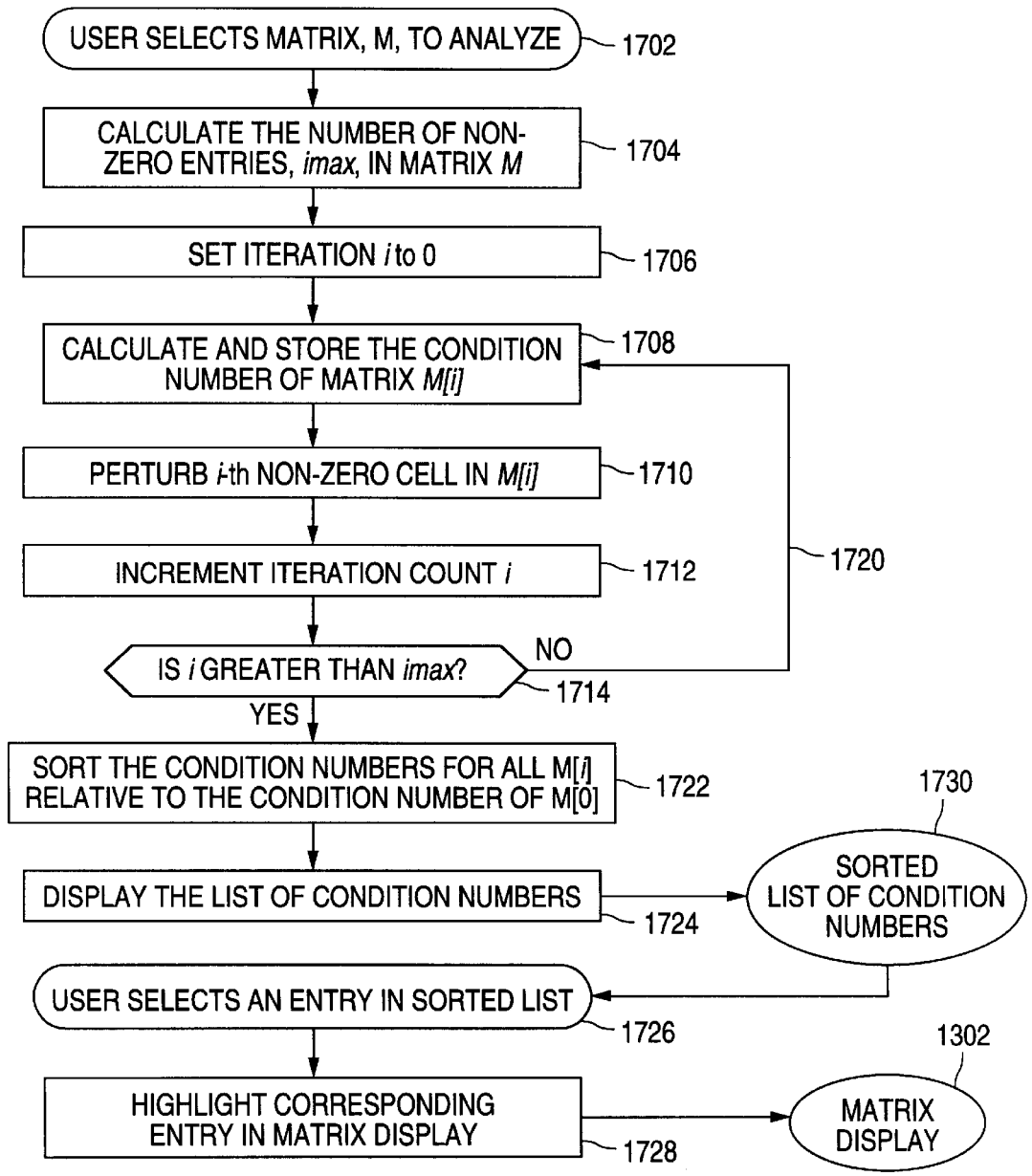
Figure 18:
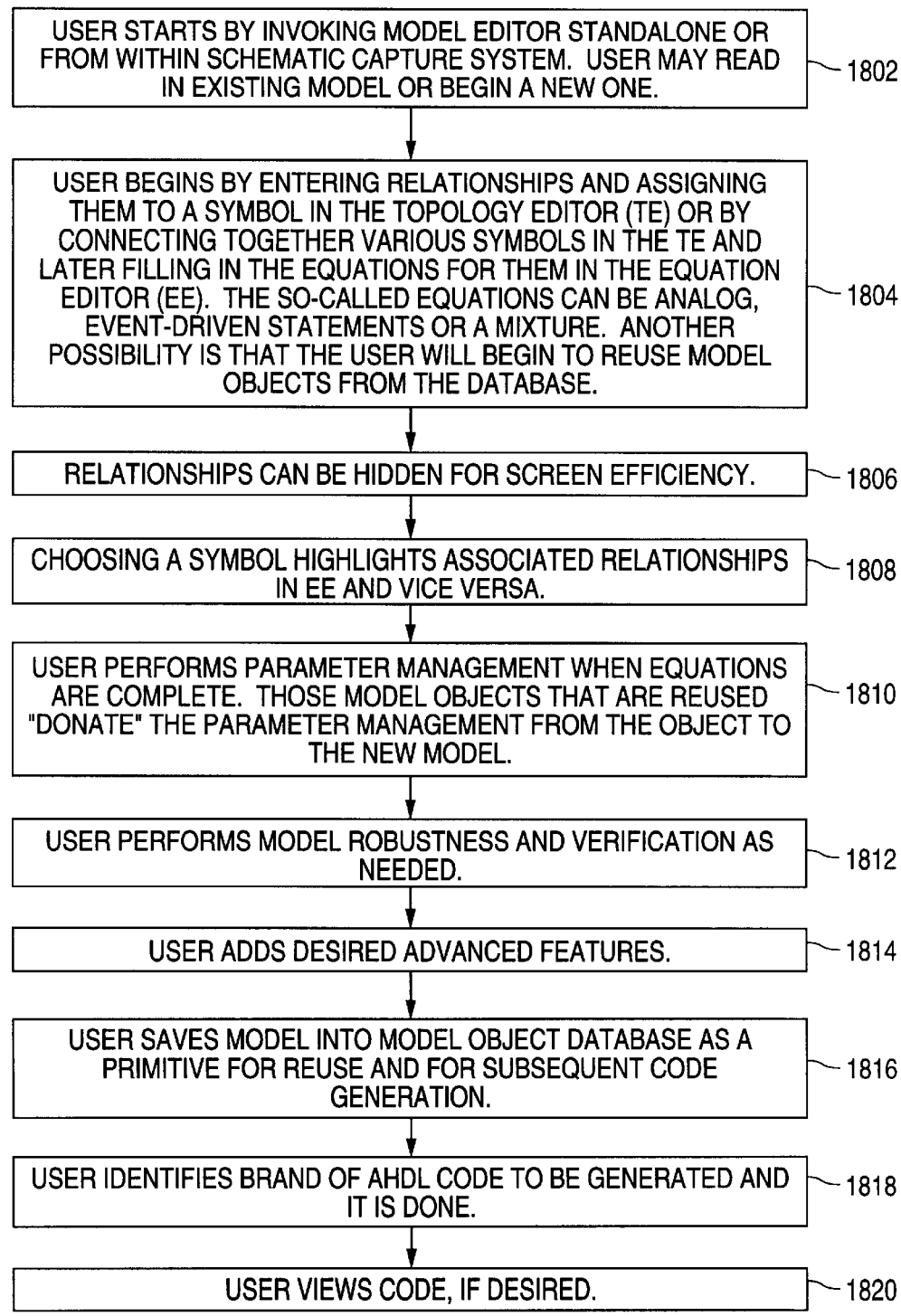

Another feature of the matrix viewer tool is a condition number analysis process, illustrated by the flowchart of FIG. 17. This process comprises a permutation-based sensitivity analysis that allows the user to trace back errors in a simulation to the model instance(s) which have the most significant contributions. The process of FIG. 17 begins with the user selecting a matrix M to analyze, step 1702. The analysis tool calculates the number of non-zero entries, imax in matrix M, step 1704. Then an iteration counter i is initialized to zero, 1706. Next, condition number analysis process calculates and stores the condition number of matrix M[i], step 1708. Then the process perturbs the i-th non-zero cell in matrix M[i], 1710. The iteration count i is incremented in step 1712. Decision 1714 determines whether i is greater than imax, i.e., whether the process has completed perturbing all of the non-zero cells in the matrix. If not, control loop 1720 is repeated, so as to calculate and store the respective condition numbers of the matrix M as each of the non-zero cells is perturbed.

Then the process advances to step 1722 which calls for sorting the stored condition numbers relative to the condition number of the initial unperturbed matrix M[0], so as to form an ordered list of condition numbers. Step 1724 calls for displaying the list of condition numbers. The user can then select an entry in the sorted list, for example by clicking a mouse, step 1726. In step 1728, the process highlights the corresponding entry in the matrix display, such as that shown in the matrix viewer window in FIG. 13. In this way, a user can easily trace back simulation problems, indicated by the condition numbers, to the responsible cells in the matrix. The user can then select those cells in the matrix viewer, as described previously with reference to FIG. 13, to reveal the model instances which have the most significant contributions to those cells. The system of the present invention thus provides a fast, interactive, easy to use environment for tracing condition number sensitivity to the most pertinent model instances.

V. Stamp Viewer

The stamp viewer tool, 122, was introduced previously with reference to FIG. 11 introducing the simulation robustness tools. FIG. 13 illustrated how the stamp viewer is invoked automatically through use of the matrix viewer process. However, the stamp viewer process can be invoked directly by a user as well. Operation of the stamp viewer is described in greater detail with reference to the flowcharts of FIGS. 20, 21 and 22.

Figure 20:
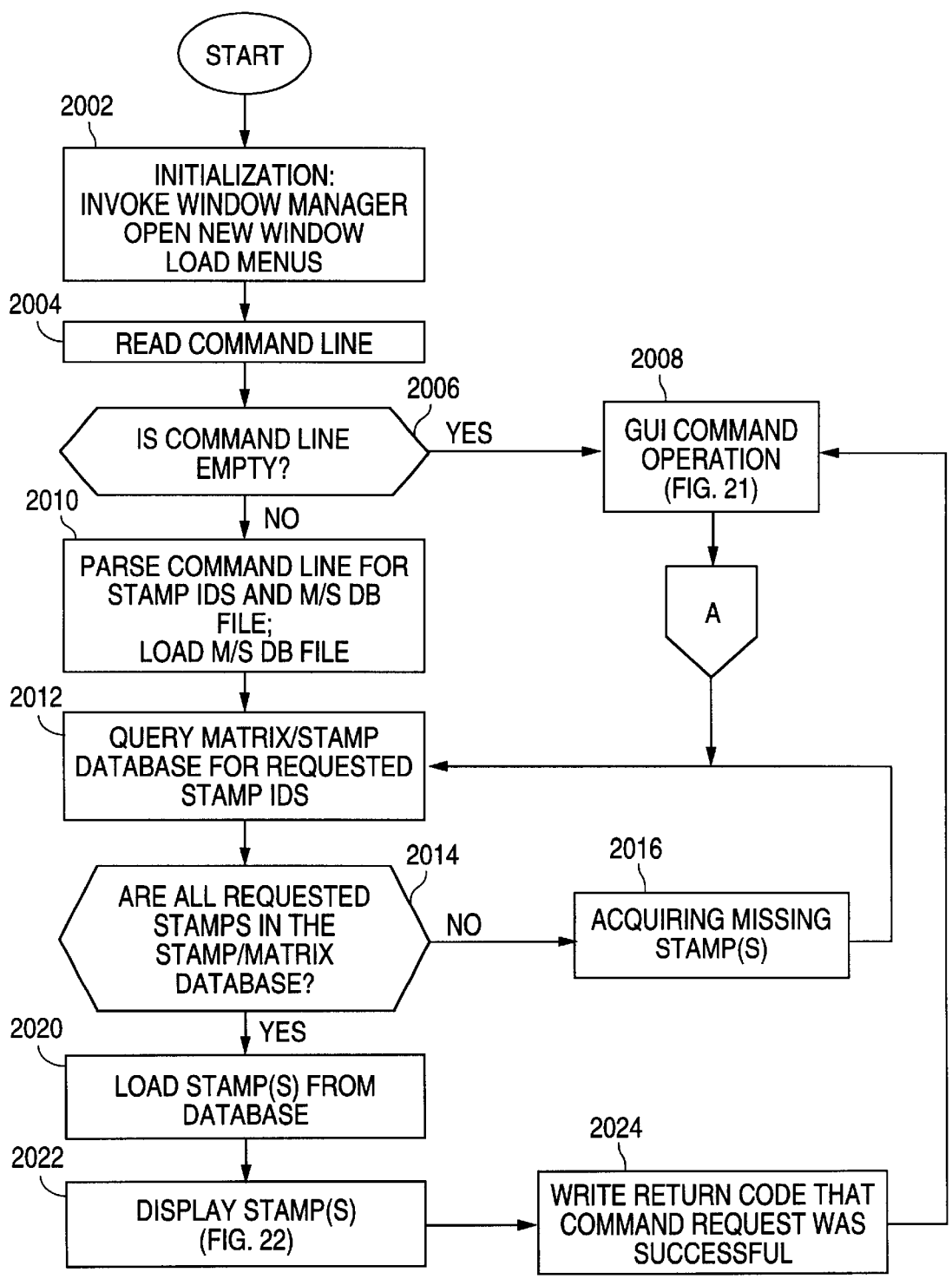

Referring to FIG. 20, the stamp viewer process begins with an initialization step 2002. A window manager tool is invoked to open a new window on the display screen and load the stamp viewer process menu. Step 2004 calls for reading a command line. A command line will be provided where another process, e.g., the matrix viewer, invokes the stamp viewer. If the command line is not empty, decision 2006, the system next parses the command line to locate stamp identifiers "IDs" and a matrix/stamp database file name. The identified matrix/stamp database file is loaded, step 2010.

Next the stamp viewer process queries the matrix/stamp database to access the stamps identified in the command line, step 2012. If all of the requested stamps are present in the stamp/matrix database, decision 2014, the specified stamps are loaded from the database for further processing, step 2020. If all of the requested stamps are not currently in the stamp/matrix database, step 2016 calls for acquiring the missing stamps, and the process loops back to step 2012. Once the stamps are loaded from the database, they are displayed, step 2022.

Figure 22:
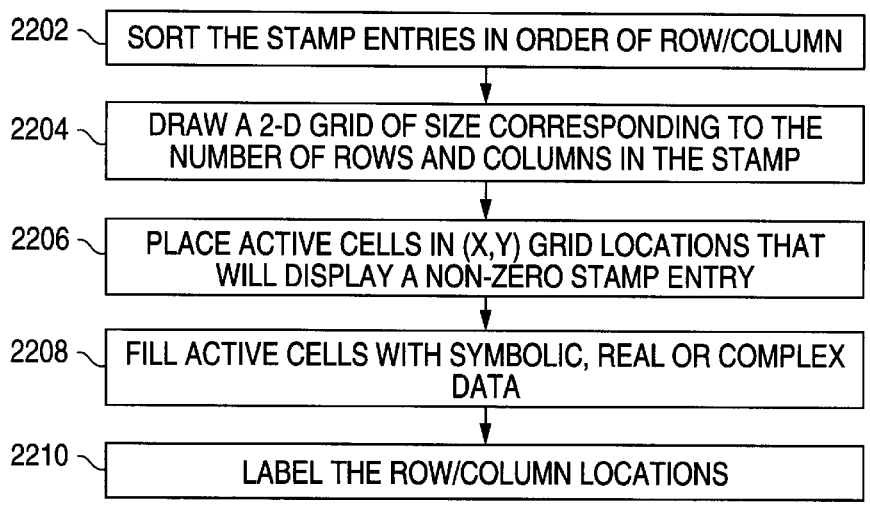

The stamp display process, step 2022, is illustrated in greater detail in the flowchart of FIG. 22. Referring to FIG. 22, the stamp display process begins by sorting the stamp entries in order of row/column, step 2202. Next the display tool draws a two-dimensional grid, sizing the grid according to the number of rows and columns in the stamp to be displayed, step 2204. Additionally, the process establishes "active cells" in grid locations that will display a non-zero stamp entry. Active cells have hyperlinks for displaying additional detail about the corresponding stamp cell. Next the display process calls for filling the active cells with symbolic, real or complex data as the case may be, step 2208. The specific display format for various types of information can be selected by user preference, for example use of scientific notation, and various forms of display for complex numbers. Finally, step 2210, the process calls for labeling the row/column locations on the grid. One example of a screen display of the type generated by this process is shown in FIG. 13, stamp viewer 1316. This process allows a user to inspect and manipulate model element stamps for evaluating robustness of a simulation in a graphical, interactive environment. Referring again to FIG. 20, following completion of the display stamps step 2022, the process generates a return code to indicate that the requested display of selected stamps has been completed successfully, step 2024. The process then proceeds back to step 2008 to receive another instruction.

Figure 21:
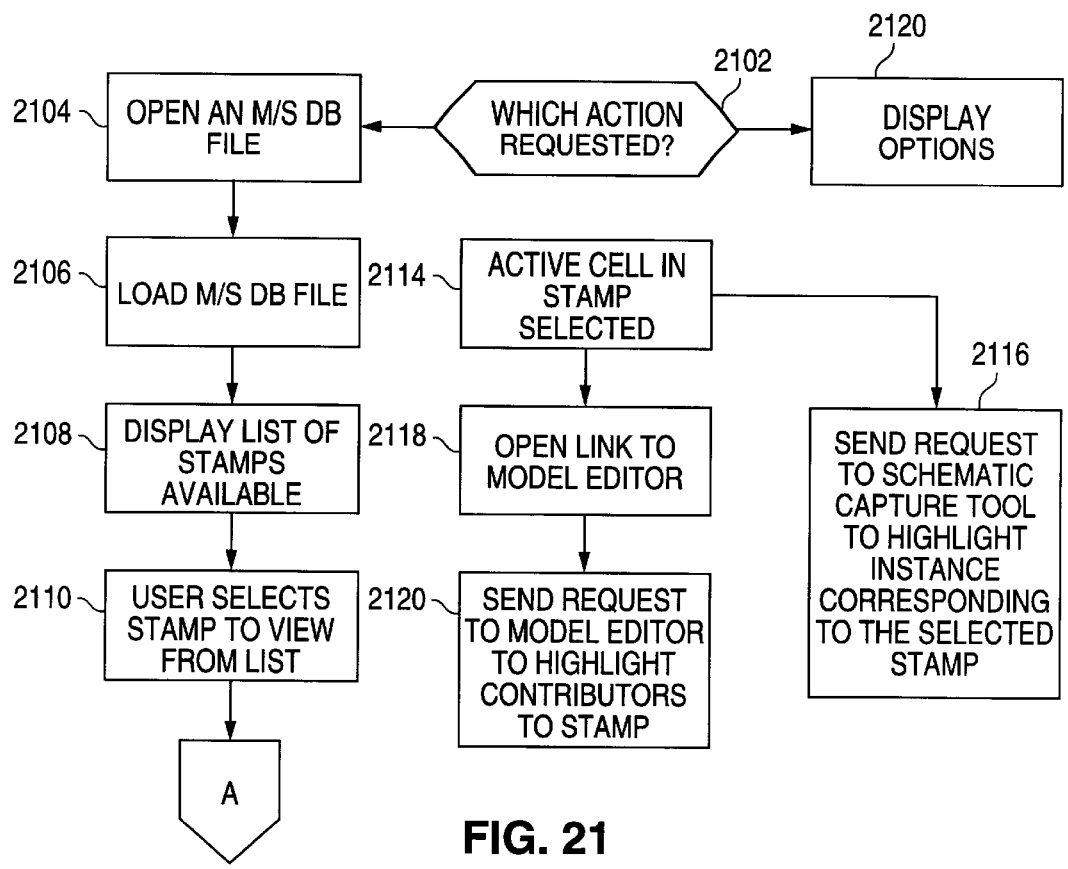

As indicated, if the command line is empty, test 2006, the process checks for an alternative graphical user interface command operation, as illustrated in FIG. 21 as follows. FIG. 21, decision 2102 determines what action is requested by the user. For example, the user might activate a pull-down menu, using a pointing device to request display of available options, step 2120. For example, one option might be to change preferences regarding details of the stamp display such as complex number format, color, etc. Another menu option may be to display a list of available matrix stamp database files. This function is provided by the file manager. Responsive to the action requested by the user, the system opens a requested matrix/stamp database file, step 2104 and loads it, step 2106. Next the system automatically displays a list of stamps available in the selected database, step 2108. The user selects a stamp to view from among the stamps displayed on the list, step 2110. The selected stamp is displayed as previously described with reference to FIG. 22.

As noted above, the stamp display includes active cells in grid locations that will display a non-zero stamp entry. The user can then select one of the active cells in the stamp display, to obtain additional information. (To illustrate, in FIG. 13, a user has selected the stamp display active cell corresponding to matrix row 6, column 7 in the stamp viewer display window 1316.) Returning to FIG. 21, the active cell is selected in step 2114. In response, the stamp display process opens a link to the model editor, step 2118, and then sends a request to the model editor to highlight contributors to the stamp under inspection, step 2120. At the same time, the process also sends a request to the schematic capture tool to highlight in the corresponding schematic the instance corresponding to the selected stamp.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A Newton step manager software tool for use in creating and revising a representation of a simulation model for modeling analog and mixed signal digital-analog physical circuits and systems in a digital computer, the Newton step manager software tool comprising:

means for measuring an indication of Newton step limiting that occurred during execution of the simulation model; and means for graphically displaying the Newton step limiting.

2. A Newton step manager software tool according to claim 1 further comprising:

means for interactively assigning Newton steps to a selected independent variable in a graphical display independently of hardware description language; and means for inserting the assigned Newton steps into the simulation model so that a user need not insert the assigned Newton steps into the simulation model by editing the model in a hardware description language.

3. A Newton step manager software process for use in development of a simulation model for modeling analog and mixed signal digital-analog physical circuits and systems, the process comprising the steps of:

simulating a predetermined model using a DC modified nodal analysis;

during said simulation, capturing a selected matrix norm at each iteration of the simulation algorithm;

during said simulation, capturing an indication of any Newton limiting at each iteration of the simulation algorithm;

plotting the captured matrix norms as a function of iteration count; and identifying on the plot which iteration counts encountered Newton limiting.

4. A Newton step manager software process according to claim 3 and further comprising the steps of:

receiving a user selection of one of the iteration counts in the plot where Newton limiting is identified;

identifying which one or more of multiple independent variables within the model were Newton limiting at the iteration count selected by the user;

determining respective values of the identified independent variables at the selected iteration count; and displaying the identified independent variables and their respective values to assist the user in further developing the model.

5. A Newton step manager method of studying and controlling Newton limiting in the iterative solution of a matrix representing a model undergoing simulation, comprising the steps of:

simulating the model in a predetermined circuit with a DC analysis in a simulator;

during the simulation, capturing the matrix norm of each iteration of the simulation algorithm;

during the simulation, capturing an indication of each Newton limit that occurs during the simulation and the iteration at which Newton limit occurred;

plotting the captured matrix norms in a screen display as a function of iteration count; and superimposing on the screen display plot an indication of each of the indicated Newton limits.

6. A Newton step manager method according to claim 5 further comprising:

receiving a user selection of one of the Newton limits indicated in the screen display plot;

responsive to the user selection of one of the Newton limits, determining which one or more of multiple independent variables were limiting and their respective values at the time the selected Newton limit occurred; and displaying the determined limiting independent variables and their respective values for user inspection.

7. A Newton step manager method according to claim 5 further comprising interactively assigning, in a graphical display, Newton steps to a selected independent variable that causes an indication of a Newton limit.

8. A Newton step manager method according to claim 7 further comprising inserting the assigned Newton steps into the simulation model so that the user need not do so by editing the model.

9. A Newton step manager software process for use in development of a simulation model for modeling analog and mixed signal digital-analog physical circuits and systems, the process comprising the steps of:

simulating a predetermined model using a DC modified nodal analysis, wherein the model includes multiple independent variables;

during said simulation, capturing a selected matrix norm at each iteration of the simulation algorithm;

during said simulation, determining the values of all independent variables at each iteration of the simulation algorithm;

relating the captured matrix norms and the independent variable values in order to identify those independent variables for which to apply Newton limiting;

determining what Newton limits to assign to the identified independent variables; and updating the simulation model according to the identified independent variables, their respective values, and the assigned Newton limits.

10. A Newton step manager software process according to claim 9, wherein the step of relating the captured matrix norms and the independent variable values comprises:

plotting the captured matrix norms as a function of iteration count;

identifying on the plot which iteration counts encountered Newton limiting;

receiving a user selection of one of the iteration counts in the plot where Newton limiting is identified; and rank-order correlating the matrix norm with the independent variable values which caused Newton limiting at the selected iteration count.

11. A Newton step manager software process according to claim 9, wherein the step of relating the captured matrix norm and the independent variable values comprises electronically correlating the captured matrix norms and the independent variable values.

12. A Newton step manager software process according to claim 9, wherein the step of determining what Newton limits to assign to the identified independent variables includes:

rank-order correlating the identified independent variables to the captured matrix norm;

selecting a most rank-order correlated independent variable;

determining all nonlinear functions of the model;

restricting the nonlinear functions to only a set of functions that depend on the most rank-order correlated independent variable;

rank-order correlating the limited set of nonlinear functions to the captured matrix norm;

selecting a most rank-order correlated nonlinear function; and using the relationship between the most rank-order correlated nonlinear function and the most rank-order correlated independent variable to compute the Newton limit value.

13. A Newton step manager software process according to claim 12, wherein the step of using the relationship between the most rank-order correlated nonlinear function and the most rank-order correlated independent variable to compute the Newton limit value includes:

identifying an iteration at which the most rank-order correlated nonlinear function exceeds a predetermined upper bound;

identifying a prior iteration at which the most rank-order correlated nonlinear function is below the predetermined upper bound;

determining values of the most rank-order correlated independent variable at the identified iteration and the identified prior iteration; and performing a linear interpolation on the most rank-order correlated independent variable to determine a value at which the most rank-order correlated nonlinear function reaches the predetermined upper bound.

14. A Newton step manager software process according to claim 12, wherein the step of restricting the nonlinear functions to only a set of functions that depend on the most rank-order correlated independent variable includes performing a functional dependency analysis to determine which nonlinear functions include the most rank-order correlated independent variable.

15. A Newton step manager software process according to claim 9, wherein the step of updating the model comprises:

inserting the identified independent variables and their respective values into the simulation model; and repeating the simulating step using the updated model.

16. A Newton step manager software process for use in development of a simulation model for modeling analog and mixed signal digital-analog physical circuits and systems, the process comprising the steps of:

simulating a predetermined model using a DC modified nodal analysis, wherein the model includes an independent variable;

during said simulation, capturing a selected matrix norm at each iteration of the simulation algorithm;

during said simulation, determining the value of the independent variable at each iteration of the simulation algorithm;

determining what Newton limit to assign to the independent variable; and updating the simulation model according to the independent variable, its value, and the assigned Newton limit.

17. A functional dependency analysis process for use in development of a simulation model in a digital computer for modeling analog and mixed signal digital-analog physical circuits and systems, the process comprising the steps of automatically:

identifying all constants, parameters, and variables of the model;

identifying which variables are dependent;

generating a dependency set for each dependent variable, where the dependency set for an individual dependent variable contains all constants, parameters, and variables on which the dependent variable depends;

updating the dependency sets for each dependent variable according to equations of the model; and using the dependency sets in a Newton step manager in the simulation model to model the analog and mixed signal digital-analog physical circuits and systems.

18. A functional dependency analysis process according to claim 17, wherein:

the step of identifying which variables are dependent further includes identifying which variables are potential independent; and the step of generating a dependency set for each dependent variable includes treating each potential independent variable as an independent variable.

19. A functional dependency analysis process according to claim 18, where a potential independent variable is a variable that meets the following conditions:

the variable is equal to an independent variable, the negative of an independent variable, or the difference of two independent variables;

the variable is either affine dependent on exactly two independent variables or linearly dependent on exactly one independent variable, and has no dependence on any other independent variables;

the variable depends on constants or parameters only in a varying manner;

the variable is part of a condition or an expression that defines a variable other than itself;

only one definition of the variable is used in the model for purposes other than to redefine the variable itself.

20. A functional dependency analysis process according to claim 19, where the potential independent variable meets the following further condition:

if the variable was at any point defined in a manner inconsistent with being a potential independent variable, then the variable is considered not to be a potential independent variable.

* * * * *